(12) United States Patent
Maruyama et al.

(10) Patent No.: US 7,215,886 B2
(45) Date of Patent: May 8, 2007

(54) OPTICAL COMMUNICATION MODULE

(75) Inventors: Shigenobu Maruyama, Ebina (JP);
Kazumi Kawamoto, Yokohama (JP);
Hiroaki Furuichi, Yokohama (JP);
Tooru Yoshida, Yamato (JP); Isamu Yoshida, Fujisawa (JP); Katsuya Oono, Fujisawa (JP); Osamu Yamada, Hiratsuka (JP); Hiroshi Ibe, Fuchu (JP); Shigeru Tokita, Yokohama (JP); Tarou Tonoduka, Yokohama (JP); Yasunori Iwafuji, Yokohama (JP); Katsumi Kuroguchi, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 786 days.

(21) Appl. No.: 10/222,163

(22) Filed: Aug. 15, 2002

(65) Prior Publication Data
US 2004/0208211 A1  Oct. 21, 2004

(30) Foreign Application Priority Data
Feb. 4, 2002 (JP) .............................. 2002-026655
Feb. 26, 2002 (JP) .............................. 2002-049205

(51) Int. Cl.
*H04B 10/00* (2006.01)
*G02B 6/36* (2006.01)
*H01L 33/00* (2006.01)

(52) U.S. Cl. ........................... 398/117; 385/92; 257/81; 257/99

(58) Field of Classification Search ................ 398/117, 398/139; 385/88–94; 372/38.1; 257/79–103
See application file for complete search history.

(56) References Cited

U.S. PATENT DOCUMENTS

| | | | | |
|---|---|---|---|---|
| 5,347,604 A | * | 9/1994 | Go et al. | ...................... 385/92 |
| 6,724,376 B2 | * | 4/2004 | Sakura et al. | ............... 345/204 |
| 6,754,406 B2 | * | 6/2004 | Kaneshiro et al. | ............ 385/14 |

FOREIGN PATENT DOCUMENTS

| | | |
|---|---|---|
| JP | 08-114728 | 5/1996 |
| JP | 09-148675 | 6/1997 |
| JP | 2001-298217 | 10/2001 |

* cited by examiner

*Primary Examiner*—Jason Chan
*Assistant Examiner*—Quan-Zhen Wang
(74) *Attorney, Agent, or Firm*—Townsend and Townsend and Crew LLP

(57) ABSTRACT

The present invention is related to an optical communication module for transmitting high frequency signals (e.g., 10 Gbit/s and higher data rates) between an optical element and an external circuit. In an illustrative embodiment, the optical communication module includes signal transmission lines and ground lines formed on a ceramic substrate, a flexible wiring board, and a printed circuit board. The widths of the signal lines and the ground lines vary, as well as the spacing between the signal and ground lines. This facilitates characteristic impedance matching among the signal lines to within about 50Ω.

12 Claims, 25 Drawing Sheets

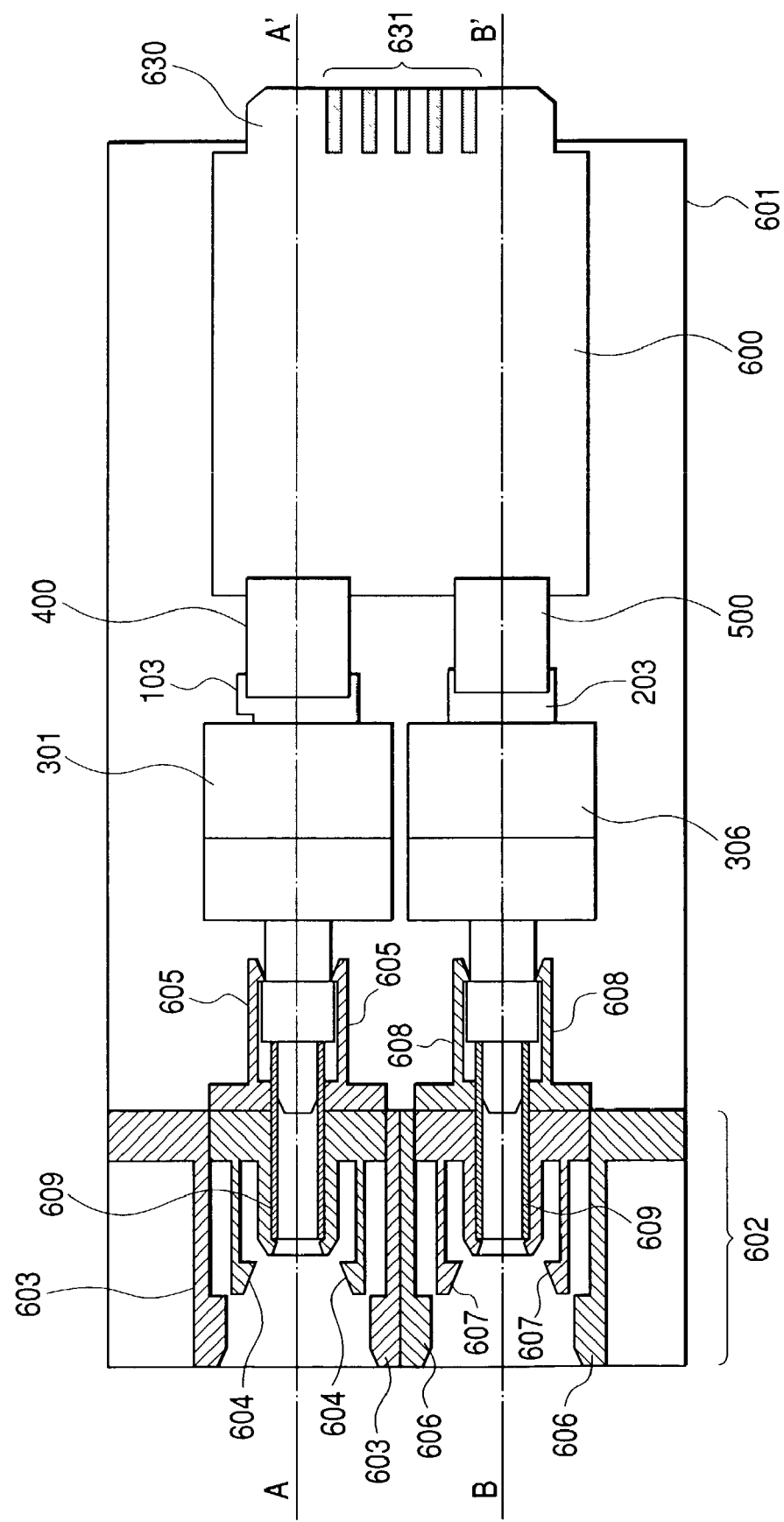

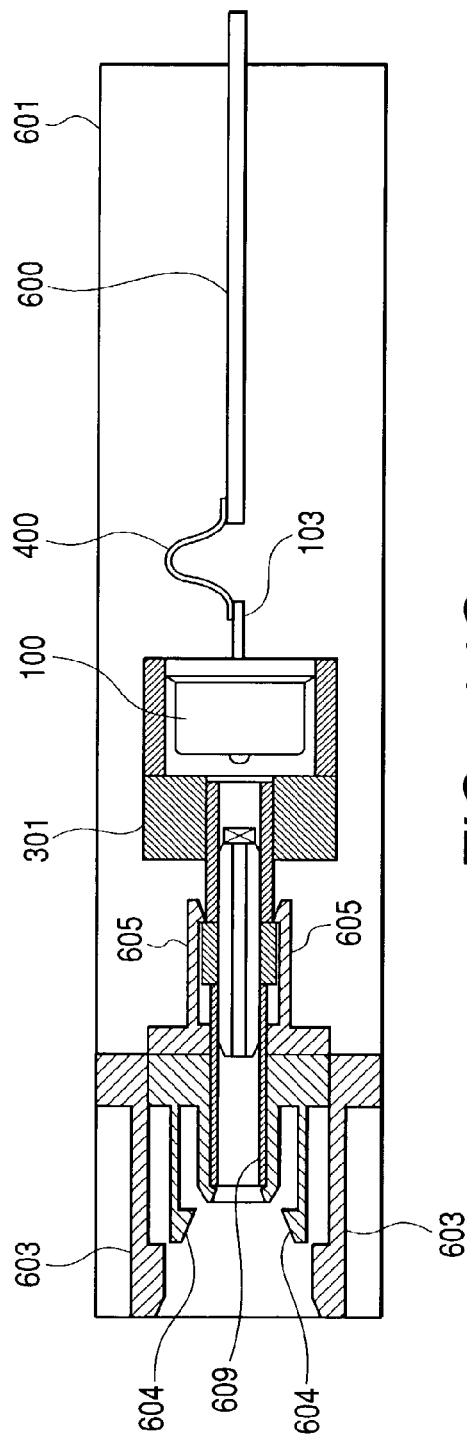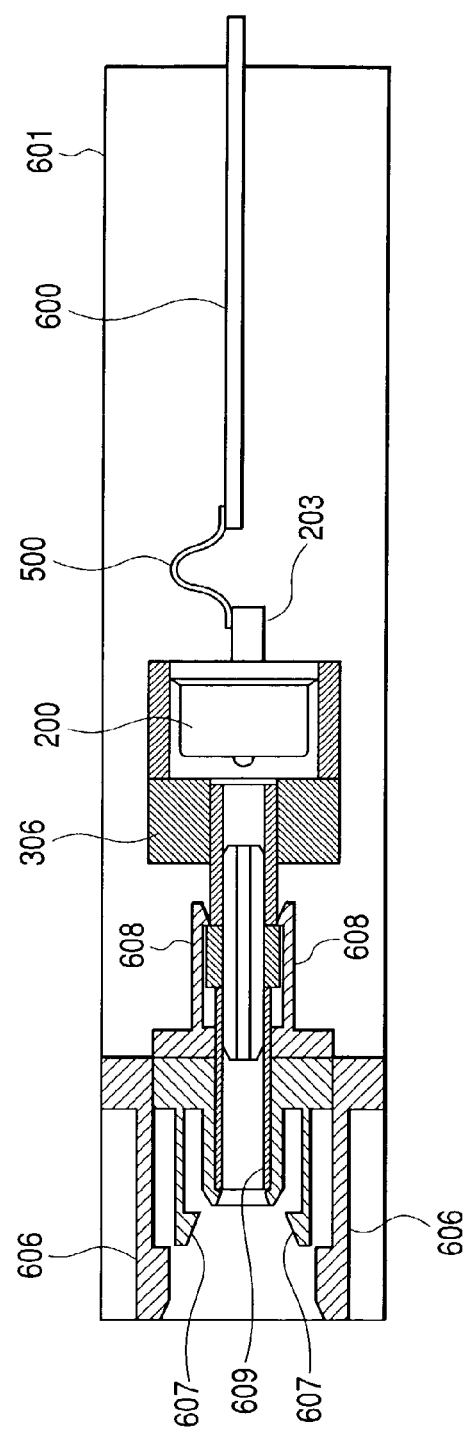

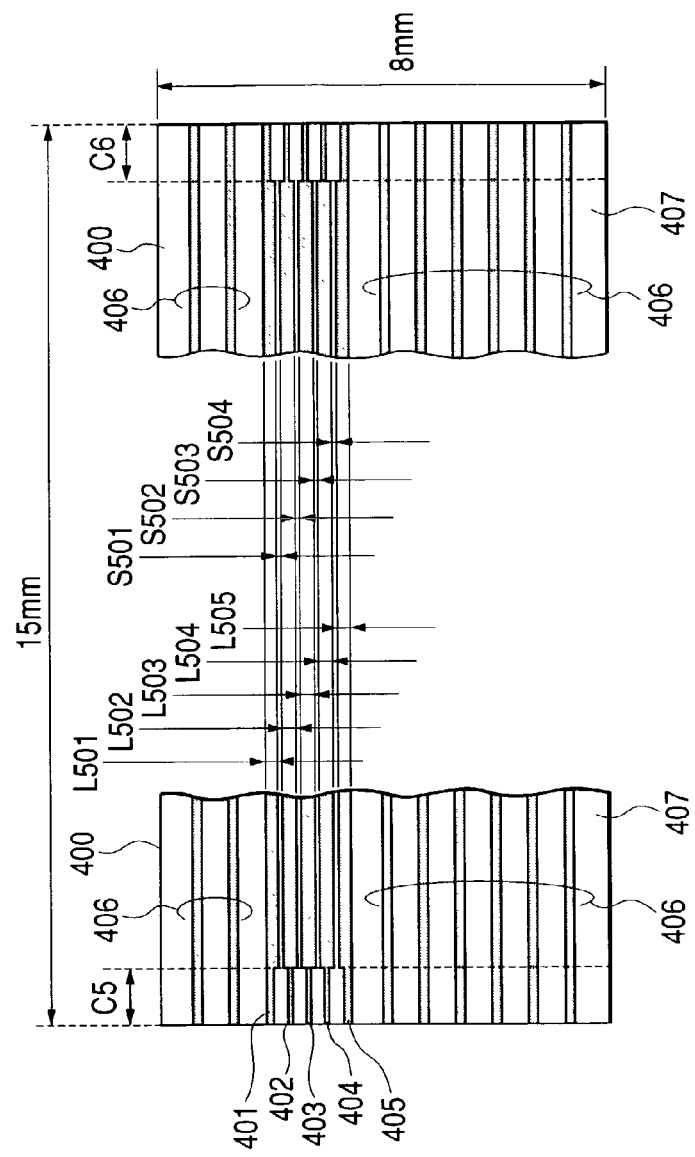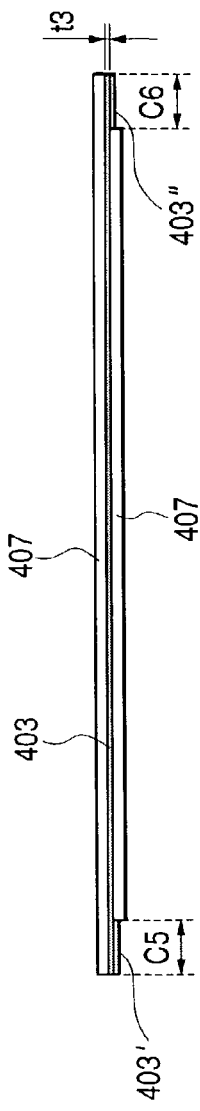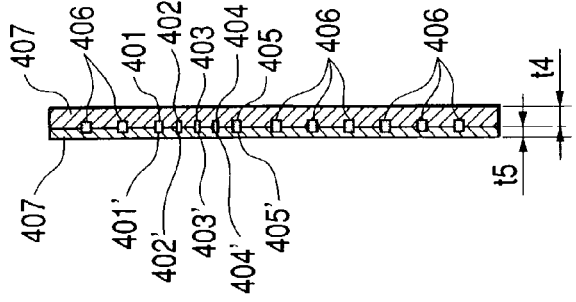

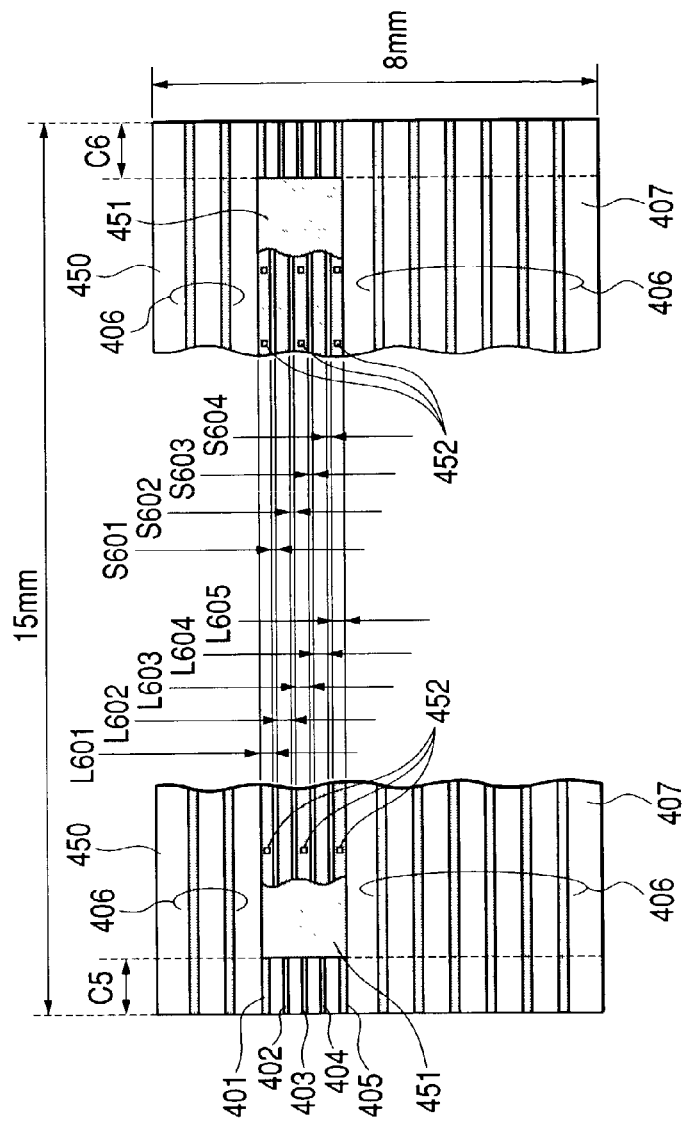
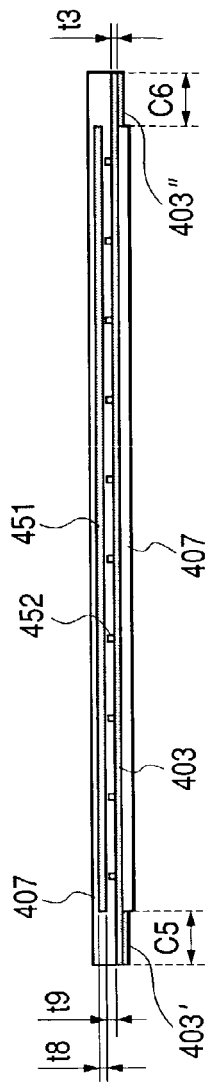
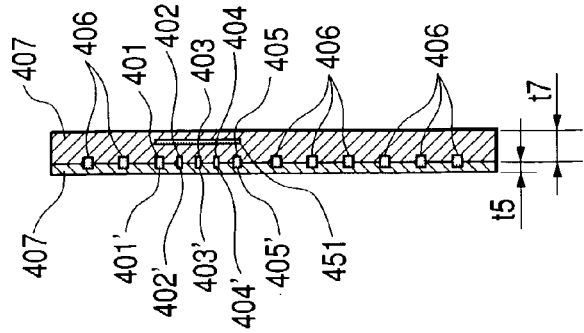
FIG. 20A
FIG. 20B
FIG. 20C

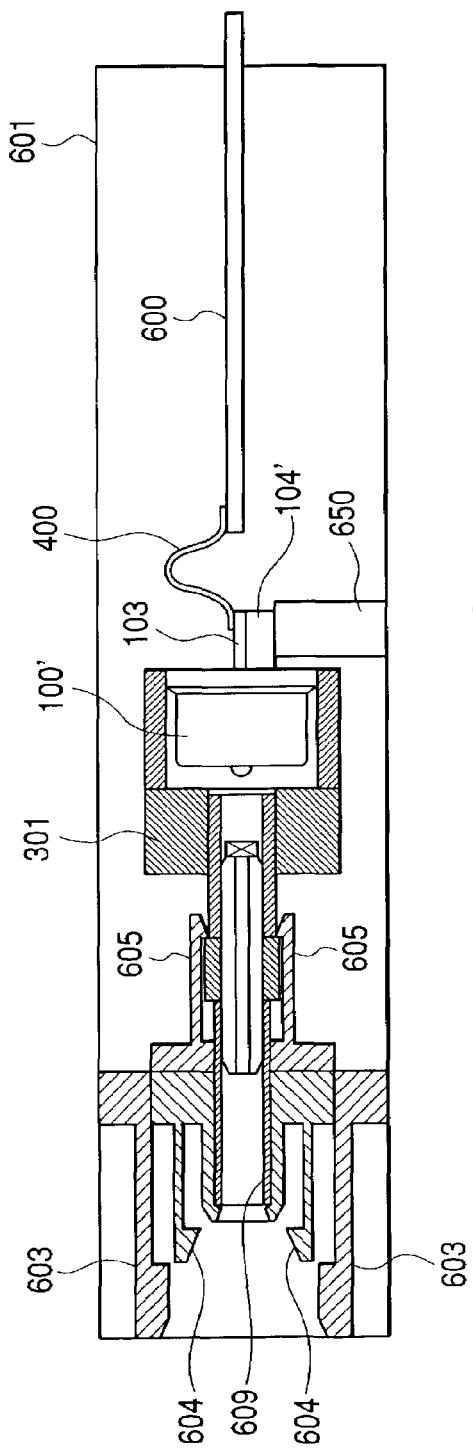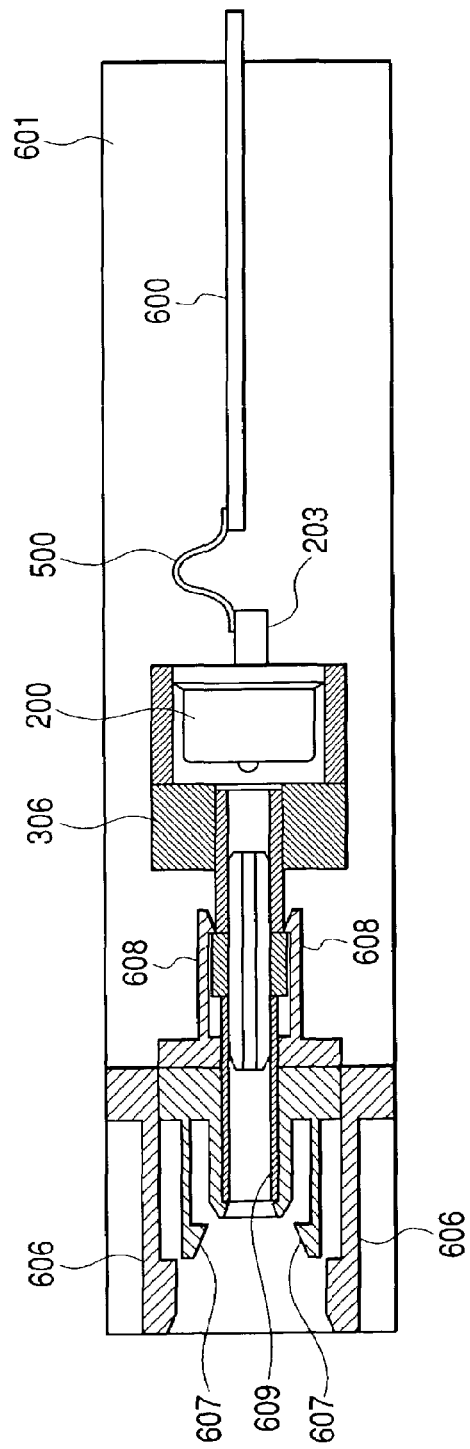

OPTICAL COMMUNICATION MODULE

FIELD OF THE INVENTION

The present invention relates to an optical communication module loading a light emitting element and a photosensitive element for transmitting and receiving a laser beam for optical communication.

DESCRIPTION OF THE RELATED ART

Optical elements, for example, a laser diode as a light emitting element and a photodiode as a photosensitive element are usually accommodated within various packages together with a lens and the other necessary components. A can-package is one of such various packages and is designed mainly considering high reliability for long-term use. A structure thereof is disclosed, for example, in the Japanese Unexamined Patent Publication No. 114728/1996 in which optical elements are shielded from the external atmosphere of the package, namely, accommodated within a hermetically sealed structure. The schematic structure thereof will be explained with reference to FIG. 24.

FIG. 24 is a side cross-sectional view of an optical communication module of the related art.

In this figure, a light emitting/photosensitive element 61 is fixed to a disc type stem 60 under the condition that it is mounted in direct thereto or previously mounted on a sub-mount (not illustrated). The stem 60 is provided with the optical element 61 and lead pins 62, 63 for electrical connection with external circuits of the can-package. A lead pin 62 is fixed in direct to the stem 60 which is electrically short-circuited from the stem 60. Meanwhile, the lead pin 63 is fixed to a stem hole 65 through a glass material 64 and is electrically insulated from the stem 60. The lead pins 62, 63 usually have the diameter of 0.45 mm and the diameter of the stem hole 65 is about 1 mm. The optical element 61 and lead pin 63 are connected with a wire bonding. Moreover, in the can-package, a cylindrical metal cap 66 is fixed to the entire part of the periphery of stem 60 by the welding process. The center of cap 66 is sealed with a lens 67 using a glass material but this lens 67 may be replaced, in a certain case, with a flat glass plate.

Signal beams can be transmitted or received easily between the can-package and optical fiber by engaging one end of a cylindrical sleeve 68 with the cap 66 and inserting a ferrule (not illustrated) at the end of optical fiber to the other end. Since the can-package is formed in the hermetically sealed structure, it does not allow invasion of water-content and oxygen or the like from the external side of the package, can prevent deterioration and characteristic variation of optical element 61 or the like and can assure the higher reliability for a ling period of time. Moreover, the optical fiber and optical element 61 can be easily coupled by utilizing the cylindrical sleeve.

A receptacle type optical communication module accommodates the can-package and a circuit substrate loading electronic components (peripheral circuits of light emitting/photosensitive element and a communication control circuit) into one cabinet and moreover integrates a receptacle type optical connectors into the cabinet in order to connect (remove) the optical fiber to and from the external side of the can-package. An example of the internal structure of the receptacle type optical communication module is disclosed in the Japanese Unexamined Patent Publication No. 298217/2001. This related art is characterized in use of a sheet of flexible printed circuit board on which an electronic components loading region and a can-package loading region are provided. Thereby, the shape of optical communication module is reduced in size. Moreover, when an optical communication module is loaded to a mother board, if an external force is generated to the lead pins holding the flexible printed circuit board, this force is never transferred to a connecting point of the can-package and flexible printed circuit board and thereby reliability of electrical connection of these elements is never lost.

In the can-package of FIG. 24, since the lead pin 63 is fixed to the stem hole 65 with a glass material 64, the diameter of stem hole 65 becomes about 1 mm, it is difficult to increase the number of lead pins and the maximum number of lead pins is set to about six (6). Therefore, the number of lead pins becomes short and the electronic circuit components such as a driver LSI for driving a laser diode and an amplifying LSI for amplifying signals of a photodiode can no longer be accommodated within the can-package. As a result, the electronic circuit components have to be installed at the external side of the package. Thereby, distance between an optical element and a driver LSI or amplifying LSI becomes longer, making difficult the application thereof into a high speed signal transmission method. Moreover, it has also been difficult in the lead pin structure to realize the matching of the characteristic impedance (usually, 50Ω) of a high speed signal transmission wiring. Therefore, the present optical communication module of the can-package is used for the communication in the speed of 2.5 Gbit/sec or less.

Moreover, in the related art of the receptacle type optical communication module, it is probable that if an external force is applied to the lead pins holding a flexible circuit board when the optical communication module is mounted on a mother board, the connecting point between the lead pins and flexible printed circuit board is broken, losing the electrical connection thereof and thereby the performance of the optical communication module is deteriorated. Moreover, it is also probable that since the mounting structure is formed not considering head radiation of can-package, when the optical communication module is used for a long period of time, the communication performance is also deteriorated due to generation of heat from the can-package.

SUMMARY OF THE INVENTION

It is therefore a first object of the present invention to provide a can-package type optical communication module for realizing high speed signal transmission.

It is a second object of the present invention to provide an optical communication module which can easily accommodate an electrical circuit component such as LSI together with an optical element into a can-package.

It is a third object of the present invention to provide an optical communication module which can easily realize the matching of the characteristic impedance of high speed signal transmission wiring with an optical element within the can-package.

It is a fourth object of the present invention to provide a receptacle type optical communication module which can realize the high speed signal transmission (10 Gbit/sec or more) through the matching between the input/output signal wiring of package (high speed signal transmission wiring) and a circuit substrate mounting the peripheral circuit of a light emitting/photosensitive element and a communication control circuit with the characteristic impedance (usually, about 50Ω) of the high speed transmission wiring.

It is a fifth object of the present invention to provide a receptacle type optical communication module of the structure that an external force generated to an optical communication module does not give any influence on the optical communication module performance when the same module is mounted to a mother board.

It is a sixth object of the present invention to provide a receptacle type optical communication module of the structure that the communication performance is never deteriorated with generation of heat of the can-package when the optical communication module is used for a long period of time.

In order to attain the objects explained above, the optical communication module of the present invention fixes a wired ceramic substrate through a first stem, mounts a can cap with a light transmitting window to the stem in such a manner as involving an optical element or an optical element and an electronic component within a can or as involving an optical element or an optical element and electronic component within a can and continuously forms a part of the wiring explained above at the internal and external sides of the can.

The optical element is mainly a light emitting element and a photosensitive element but also may include an optical element such as an optical modulator. The electronic component explained above includes a laser diode, a drive LSI and a pre-amplifier of photodiode. The first stem explained above is usually formed as a flat metal plate but it is not limited thereto.

The light transmitting window also includes an optical lens in addition to a flat plate.

The ceramic substrate explained above maybe a single-layer wired ceramic substrate or a multi-layer wired ceramic substrate.

In the preferred embodiments of the present invention, the other metal stem is fixed, to the ceramic substrate explained above, only within the can or at the internal and external sides of the can.

The ceramic substrate explained above is formed of a ceramic block combining a plurality of ceramic substrates and wiring is formed at the surfaces vertical and horizontal to the optical axis of the optical element of the ceramic block. In the case where a photodiode is used as an optical element, it is preferable that this photodiode is mounted at the surface vertical to the optical axis. Moreover, the light emitting/photosensitive element and electronic component explained above are disposed over the two parallel surfaces of the front and rear surfaces of the ceramic block and the disposed light emitting/photosensitive element and electronic component are connected via a through hole provided on the ceramic block.

Moreover, in order to achieve the objects of the present invention, following means are also provided. Namely, there is provided an optical communication module loading, over the ceramic substrate formed through a can-stem, a high speed signal transmission wiring of which characteristic impedance is matched with about 50Ω and a can-package (transmission module) provided with a solder connecting point at one end of this high speed signal transmission wiring.

In addition, the above-explained objects of the present invention can be achieved by an optical communication module loading, over the ceramic substrate formed through the can-stem, the high-speed signal transmission wiring of which characteristic impedance is matched with about 50Ω and the can-package (reception module) provided with the solder connecting point at one end of this high speed signal transmission wiring.

The above-explained objects can also be achieved by the optical communication module loading the high speed signal transmission wiring of which characteristic impedance is matched with about 50Ω and a flexible wiring substrate which is provided with the solder connecting points at both ends of the high speed signal transmission wiring.

The above-explained objects can also be achieved by the optical communication module loading the high speed signal transmission wiring of which characteristic impedance is matched with about 50Ω, a shield layer for controlling radiation of electro-magnetic wave from the high speed signal transmission wiring and the flexible wiring substrate which is provided with the and the solder connecting points at both ends of the high speed signal transmission wiring.

The above-explained objects can also be achieved by the optical communication module loading the high speed signal transmission wiring of which characteristic impedance is matched with about 50Ω and a printed circuit board which is provided with the solder connecting point at one end of the high speed signal transmission wiring and also mounts a peripheral circuit of the transmission/reception module and a communication control circuit.

The above-explained objects can also be achieved by the optical communication module loading the high speed signal transmission wiring of which characteristic impedance is matched with about 50Ω and the printed circuit board which is provided with the solder connecting point at one end of the high speed signal transmission wiring, mounts the peripheral circuit of the transmission/reception module and the communication control circuit and is also provided with a connector board for connecting the optical communication module to the mother board.

The above-explained objects can also be achieved by the optical communication module of the structure that the solder connecting point between the high speed signal transmission wiring of which characteristic impedance is matched with about 50Ω and the transmission can-package and reception can-package provided respectively with the solder connecting point at one end of the high speed signal transmission wiring which are loaded over the ceramic substrate provided through the can-stem is connected with the solder connecting point between the high speed signal transmission wiring of which characteristic impedance is matched with about 50Ω and the printed circuit board which is provided with the solder connecting point at one end of the high speed signal transmission wiring, mounts the peripheral circuit of the transmission and reception modules and is also provided with the connector board for connecting the optical communication module to the mother board with the high speed signal transmission wiring of which characteristic impedance is matched with about 50Ω and the flexible wiring board provided with the solder connecting points at both ends of the high speed signal transmission wiring.

The above-explained objects can also be achieved by the optical communication module of the structure that heat generated from the driver LSI of the laser diode built in the transmission module is radiated to a housing via a metal stem of the transmission module and the heat radiation block.

These and other objects, features and advantages of the invention will be apparent from the following more particular description of preferred embodiments of the invention, as illustrated in the accompanying drawings.

BRIEF DESCRIPTION OF THE DRAWINGS

FIG. 1A is a plan view, FIG. 1B is a cross-sectional view along the line X—X of FIG. 1A and FIG. 1C is a cross-sectional view along the line Y—Y of FIG. 1A;

FIG. 3A is a plan view, FIG. 3B is a cross-sectional view along the line X—X of FIG. 3A and FIG. 3C is a cross-sectional view along the line Y—Y of FIG. 3C;

FIG. 6A is a plan view, FIG. 6B is a cross-sectional view of FIG. 6A observed from the direction A and FIG. 6C is a cross-sectional view of FIG. 6A observed from the direction B;

FIG. 7A is a plan view, FIG. 7B is a cross-sectional view of FIG. 7A observed from the direction A and FIG. 7C is a cross-sectional view of FIG. 7A observed from the direction B;

FIG. 8A is a plan view, FIG. 8B is a cross-sectional view of FIG. 8A along the line A–A' and FIG. 8C is a cross-sectional view of FIG. 8A along the line B–B';

FIG. 10A is a plan view, FIG. 10B is a cross-sectional view of FIG. 10A along the line A–A' and FIG. 10C is a cross-sectional view of FIG. 10C along the line B–B';

FIG. 12A is a front elevation diagram and FIG. 12B is a partial side elevation diagram of the cross-sectional view;

FIG. 13A is a front elevation diagram and FIG. 13B is a partial side elevation diagram of the cross-sectional view;

FIGS. 14A, 14B, 14C respectively illustrate a mounting structure of a receptacle type optical communication module (transceiver module), and FIG. 14A is a partial plan view of the cross-section, FIG. 14B is a cross-sectional view of FIG. 14B along the line A–A' and FIG. 14C is a cross-sectional view of FIG. 14A along the line B–B';

FIG. 15A is a plan view of a wiring pattern in the transmitting optical system side and FIG. 15B is a plan view of a wiring pattern in the receiving optical system side provided over the printed circuit board;

FIGS. 16A, 16B, 16C respectively illustrate a first embodiment of a flexible wiring board, and FIG. 16A is a plan view, FIG. 16B is a side elevation diagram and FIG. 16C is a cross-sectional view of the wiring of the flexible wiring board;

FIG. 17A is a plan view of the connecting point C5 and FIG. 17B is an explanatory diagram of the plan view of the connecting point C6;

FIG. 18A is a plan view and FIG. 18B is a side elevation diagram;

FIG. 19A is a plan view and FIG. 19B is a side elevation diagram;

FIGS. 20A, 20B, 20C respectively illustrate a third embodiment of the flexible wiring board. FIG. 20A is a plan view, FIG. 20B is a side elevation diagram and FIG. 20C is a cross-sectional view of the desired wiring on the flexible wiring board;

FIG. 21A is a plan view, FIG. 21B and FIG. 21C are respectively cross-sectional views of FIG. 21A along the lines A–A' and B–B';

FIGS. 22A, 22B, 22C respectively illustrate a mounting structure of a second embodiment of the receptacle type optical communication module (transceiver module) provided with the transmitting and receiving functions, FIG. 22A is a partial plan view of cross-section, FIG. 22B is a cross-sectional view of FIG. 22A along the line A–A' and FIG. 22C is a cross-sectional view of FIG. 22A along the line B–B';

FIG. 23A is a plan view and FIG. 23B is a side elevation diagram.

DESCRIPTION OF THE PREFERRED EMBODIMENTS

The preferred embodiments of the present invention will be explained with the accompanying drawings.

Figure 1A:
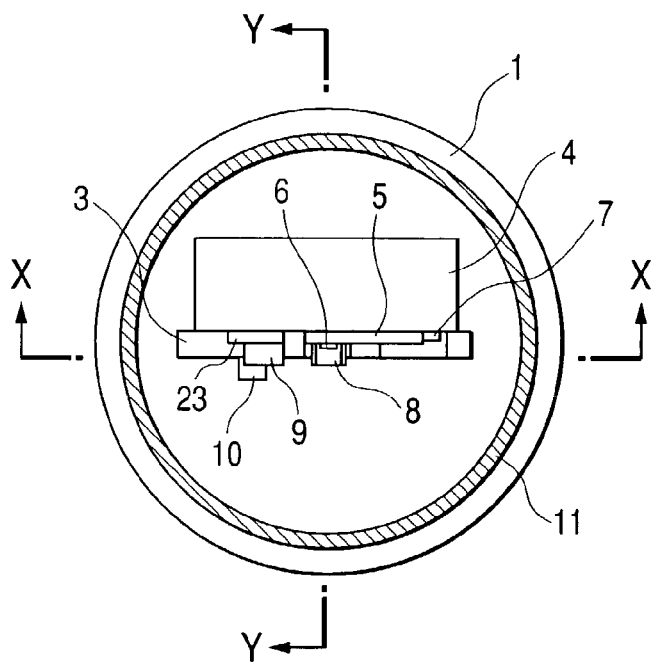
FIGS. 1A, 1B and 1C respectively illustrate a structure of a first embodiment of an optical communication module of the present invention.
Figure 1B:
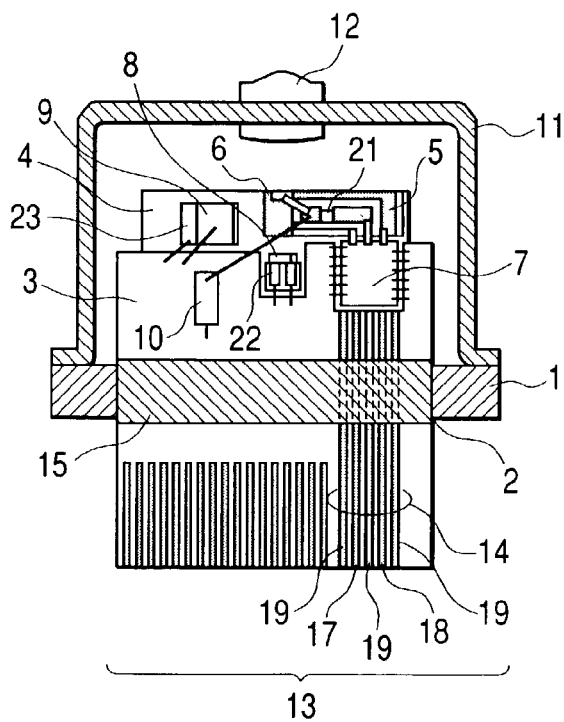
Figure 1C:
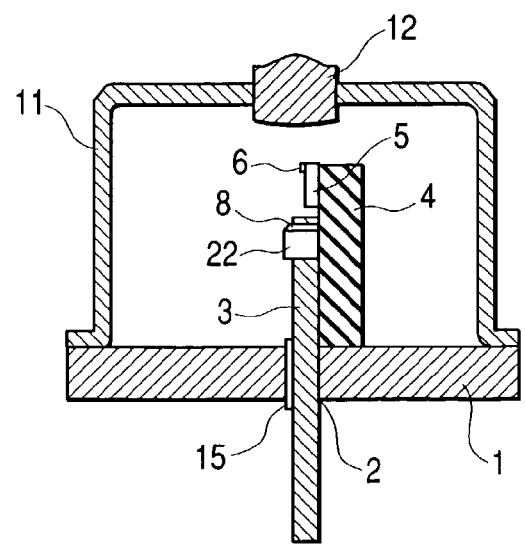

FIGS. 1A, 1B, 1C respectively illustrate a structure of a first embodiment of an optical communication module of the present invention. FIG. 1A is a plan view, FIG. 1B is a cross-sectional view of FIG. 1A along the line X—X and FIG. 1C is a cross-sectional view of FIG. 1A along the line Y—Y. This embodiment relates to a transmitting optical communication module including a laser diode as a light emitting element. First, a total structure will be explained. A ceramic substrate 3 provided with a wiring 13 is fixed through a substrate through-hole 2 of a disc type can-stem 1. A metal stem 4 is also fixed to the upper surface of the can-stem 1 and the ceramic substrate 3. On the plane parallel to the optical axis of the metal stem 4, a light emitting element and electronic components such as a laser diode carrier 5, a laser diode 6, a driver LSI 7, a monitor photo-diode 8, a thermistor 9, a thermistor carrier 23, an inductor for bias terminal 10 and a monitor photodiode carrier 22 or the like are loaded. On the upper plane of the can-stem 1, a can-cap 11 is fixed and a lens 12 is fixed at the center on the upper plane of the can-cap 11.

Individual portions of the transmitting optical communication module will then be explained in detail. The disc type can-stem 1 is a metal stem formed of cobalt or the like and this stem is provided previously with a substrate through-hole through the ceramic substrate 3. The ceramic substrate 3 is formed of an alumina or aluminum nitride or the like and is provided with a wiring required as an electric circuit, an electrode for wire bonding (details are not illustrated) and an external electrode 13 required for connection with external circuits of the module. The wiring can be formed with the printing of paste such as tungsten and burning and a through-hole is also formed as required to form a multi-layer wiring substrate. The electrode for wire bonding and external electrode 13 are formed with the plating of Ni/Au on tungsten or the like.

Figure 2:
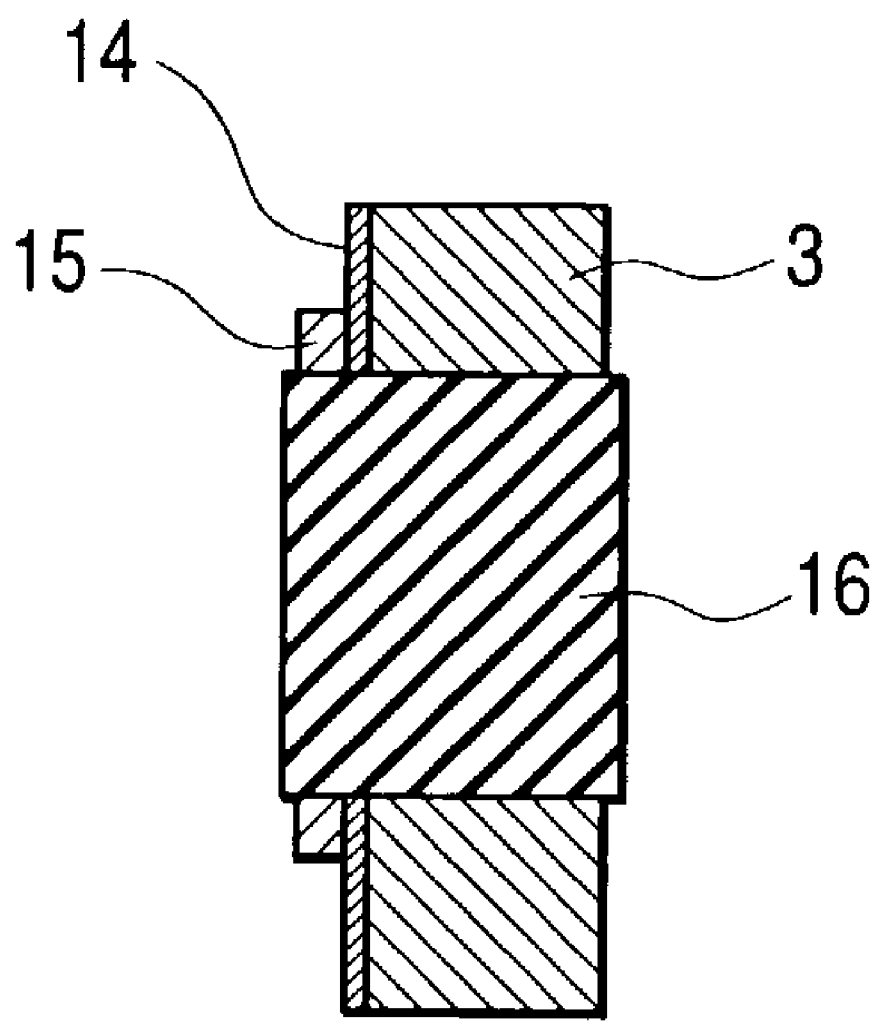
FIG. 2 is a cross-sectional view showing an embodiment of a ceramic substrate of the optical communication module of FIG. 1.

At the area of the ceramic substrate 3 to be fixed through the substrate through-hole 2, a metallized layer of tungsten/Ni/Au is formed on the entire part of the circumference and is fixed to the can-stem 1 in the substrate through-hole 2 using the silver-alloy brazing process. In this case, when it is required, from the transmission characteristic, to form the high speed signal transmission wiring 14 only on the surface of the ceramic substrate 3, an insulation layer 15 is provided to the area where the high speed signal transmission wiring 14 of the ceramic substrate 3 is fixed, as illustrated in FIG. 2, at the substrate through-hole 2 and a metallized layer 16 for stem junction of tungsten/Ni/Au is formed to the entire part of the circumference of the surface including the surface of the insulation layer 15 at the area for the fixing in the substrate through-hole 2. In this embodiment, alumina is also used for the insulation layer 15 like the ceramic substrate 3 but the present invention is not limited thereto. As explained above, the can-stem 1 and ceramic substrate 3 are joined with a metal material such as silver-alloy brazing process for ensuring hermetical sealing thereof.

Here, the high speed signal transmission wiring 14 using the alumina substrate as the ceramic substrate 3 is formed of two differential signal wirings 17, 18 to transmit the signals having the polarities inverted with each other. With this differential signal system, energy loss of signal and unwanted radiation to the external circuits can be controlled. A ground wiring 19 is also formed in both right and left sides of the differential signal wirings 17, 18 and in the area between these differential wirings. Since the characteristic impedance of wiring is matched with 50Ω, the width of differential signal wirings 17, 18 is set to 0.19 mm, the space to the ground wiring 19 is 0.06 mm and thickness of the ceramic substrate 3 is set to 0.5 mm. In this embodiment, twenty-two (22) wirings in total are formed including the five (5) differential signal wirings 17, 18 and the ground wiring 19 and these wirings are all guided to external electrodes 13 of the same number. The high speed signal transmission wiring, many electric wirings and external electrodes in the present embodiment have been realized using the ceramic substrate 3 which is fixed through the substrate through-hole 3 of the can-stem 1.

The metal stem 4 is formed of a metal material having the large thermal conductivity (200 W/(m·K)) like a copper-tungsten alloy and the thermal expansion coefficient (5 to 7 $\times 10^{-6}/_o$) which is identical to that of covar of the can-stem 1 and alumina or aluminum nitride of ceramic substrate 3 or the like and is fixed to the can-stem 1 with the silver-alloy brazing process or the like. The metal stem 4 made of the copper-tungsten alloy works to effectively transfer the heat generated by the driver LSI 7 explained later in order to release the generated heat.

The laser diode carrier 5 is loaded on the surface parallel to the optical axis of the metal stem 4. This loading of laser diode carrier 5 on the metal stem 4 is realized, for example, with the soldering process of gold-tin and tin-silver alloys. The laser diode carrier 5 is the ceramic substrate made of aluminum nitride or the like and is provided with an impedance matching resistor 21. This impedance matching resistor 21 uses, for example, a thin film resistor of nickel-chromium or the like or a chip resistor or the like formed on the laser diode carrier 5.

The laser diode 6 is loaded to the laser diode carrier 5. This loading of laser diode 6 to the laser diode carrier 5 is realized, for example, with the soldering process of gold-tin, tin-silver alloys or the like. A signal beam of the laser diode 6 is emitted upward in FIG. 1B and the center of light emission is located at the center of the can-stem 1 of FIG. 1A through the positioning of the metal stem 4, laser diode carrier 5 and laser diode 6. If the impedance matching resistor 21 is unnecessary, the laser diode 6 may be loaded in direct to the metal stem 4 without use of the laser diode carrier 5.

The driver LSI 7 to drive the laser diode 6 is allocated on the metal stem 4 as nearest as possible to the laser diode carrier 5. Loading of the driver LSI 7 on the metal stem 4 is realized, for example, with the soldering process of gold-tin or tin-silver alloy, etc. or with the fixing by a bonding agent such as a silver-epoxy-based bonding agent. In this embodiment, the driver LSI 7 has 17 terminals and this driver LSI 7 can be installed near to the laser diode 6 to provide the 17 wirings to the outside of the can by introducing the structure that the ceramic substrate 3 is provided through the can-stem 1.

The monitor photodiode 8 is loaded previously to the monitor photodiode carrier 22 and its photosensitive surface is located at the position to receive the light beam emitted from the rear side of the laser diode 6. Loading of the monitor photodiode 8 to the monitor photodiode carrier 22 and loading of the monitor photodiode carrier 22 to the metal stem 4 can be realized, for example, with the soldering process of the gold-tin or tin-silver alloy. The monitor photodiode carrier 22 is provided with the wirings at the surface loading the monitor photodiode 8 and the surface parallel to the surface of the ceramic substrate 3.

The thermistor 9 for monitoring temperature of the laser diode 6 is loaded to the thermistor carrier 23 made of aluminum nitride or the like to assure electrical insulation from the metal stem 4 and the thermistor carrier 23 is disposed on the metal stem 4 near the laser diode 6. Loading of the thermistor 9 to the thermistor carrier 23 and loading of the thermistor carrier 23 to the metal stem 4 may be realized with the soldering process, for example, of gold-tin or tin-silver alloy or the like. The thermistor 9 may also be loaded to the laser diode carrier 5. Moreover, in this embodiment, the inductor 10 for preventing leak of a high frequency drive signal of the laser diode 6 to the external circuit from the bias terminal to give the bias potential of the laser diode 6 is loaded on the ceramic substrate 3. Loading of the inductor 10 to the ceramic substrate 3 is realized, for example, with the soldering process of gold-tin or tin-silver alloy. Each component explained above is electrically connected with the wire bonding or ribbon bonding process.

Meanwhile, the cylindrical can-cap 11 is formed of the same material as the can-stem 1, the center area of upper surface of the can-cap 11 is opened and is sealed with the lens 12 using a glass material. In this embodiment, an aspherical lens with less spherical aberration is used to enhance optical coupling efficiency between the laser beam from the laser diode 6 and the an optical fiber (not illustrated) to receive the laser beam, but it is also possible to use a low price ball lens when the laser beam power is enough. The can-cap 11 is mounted to the can-stem 1 to attain the matching between the center of light emission of the laser diode 6 and the center of the lens 12. For example, while the can-cap 11 is overlapped on the can-stem 1, the optimum position of the can-cap 11 on the can-stem 1 is obtained by controlling the laser diode 6 to emit the beam and measuring a laser beam power from the lens 12 and the can-cap 11 and can-stem 1 are welded in the ring shape with the resistance welding method. Moreover, in the structure that the lens is provided at the external side of the can-module, a glass plate (not illustrated) may be attached to the opening at the center of upper surface of the can-cap 11. In this case, hermetical sealing is not always required depending on the required reliability and sealing by a bonding agent is also allowed.

Figure 3A:
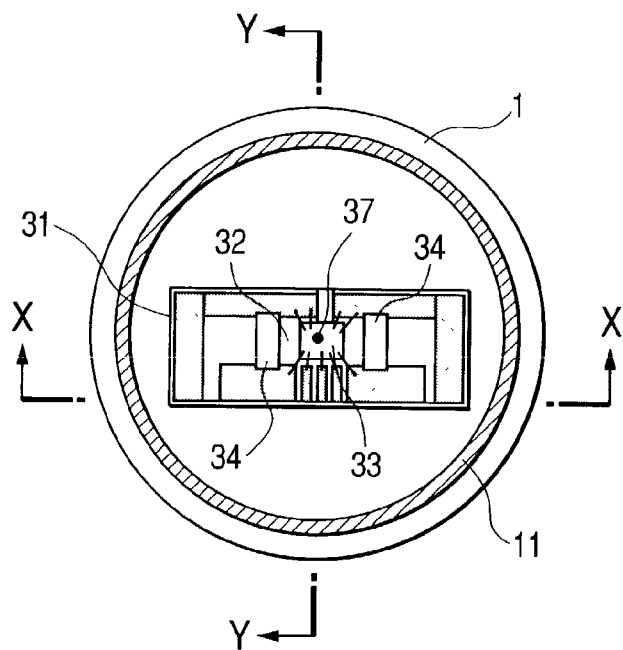
FIGS. 3A, 3B, 3C respectively illustrate a structure of a second embodiment of the optical communication module of the present invention.
Figure 3B:
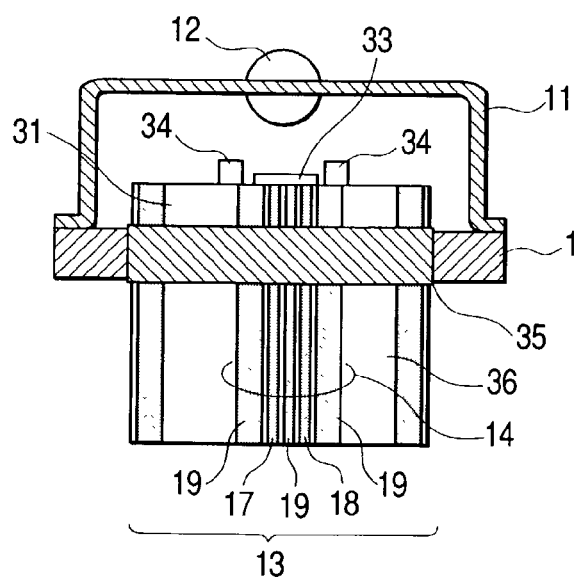
Figure 3C:
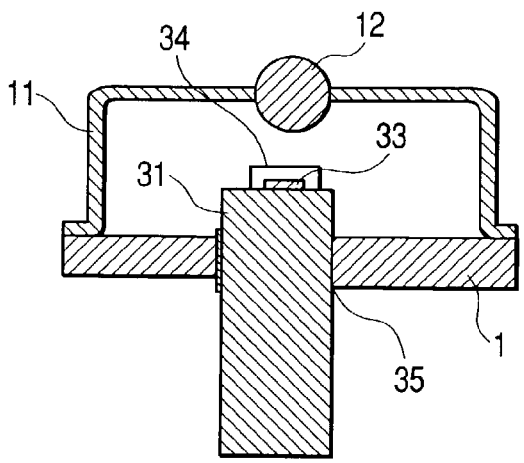

FIGS. 3A, 3B, 3C respectively illustrate a structure of a second embodiment of the optical communication module of the present invention. FIG. 3A is a plan view, FIG. 3B is a cross-sectional view of FIG. 3A along the line X—X and FIG. 3C is a cross-sectional view of FIG. 3A along the line Y—Y. This embodiment embodies the receiving optical communication module including a photodiode. Moreover, in this embodiment, an Opto-Electronic IC (OEIC) integrating a photodiode and a pre-amplifier is used as the element having the function of the photodiode.

First, the total structure of the receiving optical communication module will be explained. A wired ceramic block 31 is fixed through a ceramic block through-hole 35 of the disc type can-stem 1. The OEIC 33 is loaded on an OEIC loading plane 32 crossing vertically or obliquely with the optical axis of the ceramic block 31. On the OEIC plane 32, a capacitor 34 is disposed near to the OEIC 33 in order to stabilize the power supply voltage. On the surface of can-stem 1, the can-cap 11 is fixed. At the center of the upper surface of can-cap 11, a lens 12 is fixed.

Individual portions of the receiving optical communication module will be explained in detail. The disc type can-stem 1 is a metal stem formed of covar or the like and is provided with the ceramic block through-hole 35 for previously providing the ceramic block 31. The ceramic block 31 is made of alumina, aluminum nitride or the like and is also provided with wirings required as the electric circuit, electrode for wire bonding and external electrode 13 required for connection with the external circuit of module. The wirings are formed by printing of paste such as tungsten or the like and the burning and the wiring on the photodiode loading plane 32 is connected with the wiring on the external electrode forming plane 36 at the area where both planes are crossing. Namely, the wiring of the ceramic block 31 is formed only on the external surface of the ceramic block 31.

Figure 4:
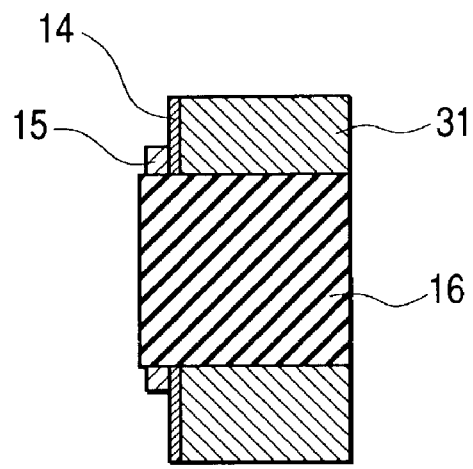
FIG. 4 is a cross-sectional view showing the embodiment of the ceramic substrate of the optical communication module of FIG. 3.

The wire bonding electrode and external electrode 13 are provided with the plating of Ni/Au on tungsten. At the area where the ceramic block 31 is fixed in the block through-hole 35, the insulation layer 15 is provided as illustrated in FIG. 4. At the area fixed at the block through-hole 35 including the surface of the insulation layer 15, a metallized layer 16 for stem junction of tungsten/Ni/Au is formed to the entire part of the circumference of the surface and this metallized layer is then fixed to the can-stem 1 with the silver-alloy brazing method.

In this embodiment, alumina is also used for the insulation layer 15 like the ceramic substrate 3 but the present invention is not limited thereto. As explained above, the can-stem 1 and ceramic block 31 can be joined under the hermetical sealing condition through the metal sealing method. Here, the alumina substrate is used as the ceramic block 31 and the high speed signal transmission wiring 14 is structured as explained below. The signal wiring is formed of two differential signal wirings 17 and 18 to transmit the signals having the inverted polarities with each other. The ground wiring 19 is formed in both right and left sides of the differential signal wirings 17, 18 and in the area between these two wirings. In this embodiment, in order to obtain the characteristic impedance of wiring matched to 50Ω, the width of differential signal wirings 17, 18 is set to 0.19 mm and a space for the ground wiring 19 is set to 0.06 mm. In the high speed signal transmission wiring design of the present embodiment, energy loss of signal and unwanted radiation of signal to external circuit can be controlled with this differential signal system by means of the ceramic block 31 fixed through the block through-hole 35 of the can-stem 1.

The OEIC 33 is loaded on the OEIC loading plane 32 vertical to the optical axis of the ceramic block 31. Loading of the OEIC 33 to the OEIC loading plane 32 can be realized, for example, with the soldering process of gold-tin or tin-silver alloy or with the fixing by the bonding agent such as a silver-epoxy-based bonding agent. Here, the positions of the ceramic block 31 and OEIC 33 are determined to locate the center of the photosensitive surface of the photodiode 37 built in the OEIC 33 to the center of the can-stem 1 of FIG. 3. On the OEIC loading plane 32, a capacitor 34 is allocated near the OEIC 33 to stabilize the power supply voltage of the OEIC 33.

In this embodiment, a low noise and high speed signal transmission can be realized using the OEIC 33 integrating the photodiode and preamplifier and the differential signal wiring of which characteristic impedance is matched with 50Ω. The total number of wirings is 7 and many high speed signal wirings may be guided to the external side of the can by introducing the structure where the ceramic block 31 is provided through the can-stem 1. The OEIC 33 is connected to the wiring with the wire bonding and ribbon bonding.

Meanwhile, the cylindrical can-cap 11 is formed of the same material as the can-stem 1 such as covar or the like. The center of the upper surface is opened and sealed by the lens 12 using a glass material. In this embodiment, a low price ball lens is used as the lens 12 but an aspherical lens or the like having higher performance may be used depending on the performance required. The can-cap 11 is fitted to the can-stem 1 to locate the center of the photosensitive surface of the photodiode 37 built in the OEIC 33 to the center of the lens 12. In this method, for example, under the condition that the can-cap 11 is overlapped on the can-stem 1, the optimum position of the can-cap 11 on the can-stem 1 is obtained by guiding the laser beam from the external circuit to the photodiode 37 via the lens 12 and then measuring the photosensitive power of the photodiode 37 and the can-stem 1 are welded in the ring shape with the resistance welding method. Moreover, when the structure that the lens is provided at the external side of the can-module is introduced, a glass plate (not illustrated) may be fitted to the opening at the center of the upper surface of the can-cap 11. In this case, hermetical sealing is not always required depending on the required reliability and sealing by a bonding agent is also permitted.

Figure 5:
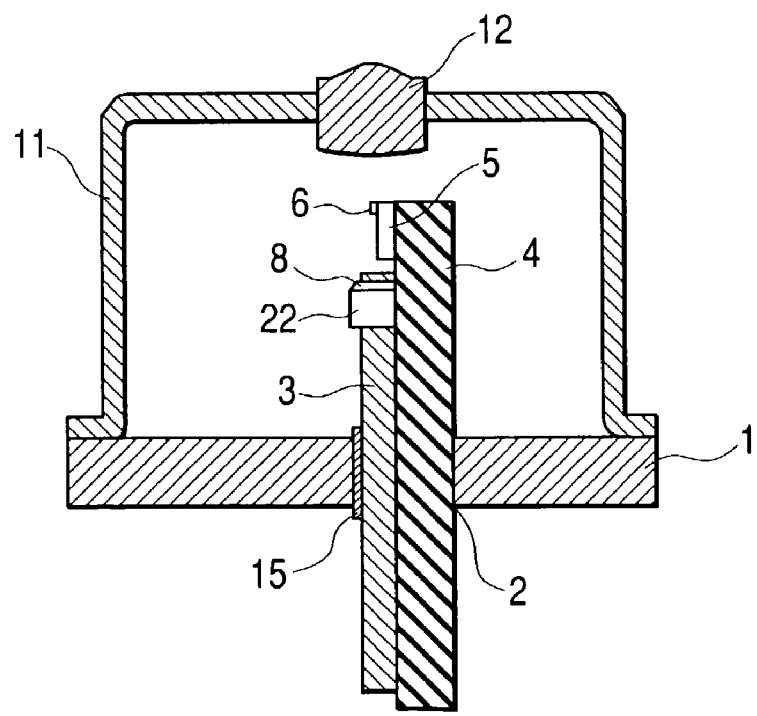
FIG. 5 is a side cross-sectional view showing a third embodiment of the optical communication module of the present invention.

FIG. 5 is a side cross-sectional view showing a structure of a third embodiment of the optical communication module of the present invention. The plan view and cross-sectional view along the line X—X of the optical communication module of the present invention are similar to FIG. 1A and FIG. 1B, respectively. Namely, the third embodiment is different from the first embodiment only in the cross-sectional view along the line Y—Y and is identical to the first embodiment, except for the point that the metal stem 4 is extended to the external side of can through the can-stem 1. The structural elements like those of the embodiment shown in FIG. 1 are designated with the like reference numerals of FIG. 1 and the same explanation is not repeated here. Since the metal stem 4 has a large thermal conductivity, more effective heat radiation can be realized by connecting the part of the metal stem extended to the external side of can to a heat radiation fin (not illustrated) of a package for loading the entire part of the can type optical communication module in direct or via a metal block (not illustrated) made of aluminum or the like having a large thermal conductivity.

Figure 6A:
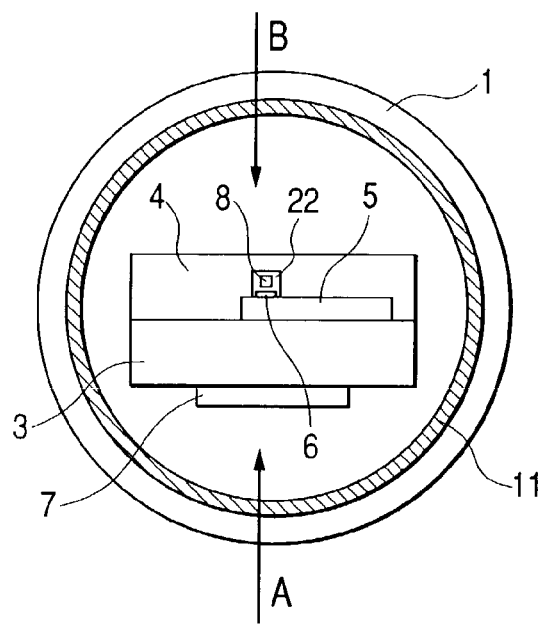
FIGS. 6A, 6B, 6C respectively illustrate a structure of a fourth embodiment of the optical communication module of the present invention.
Figure 6B:
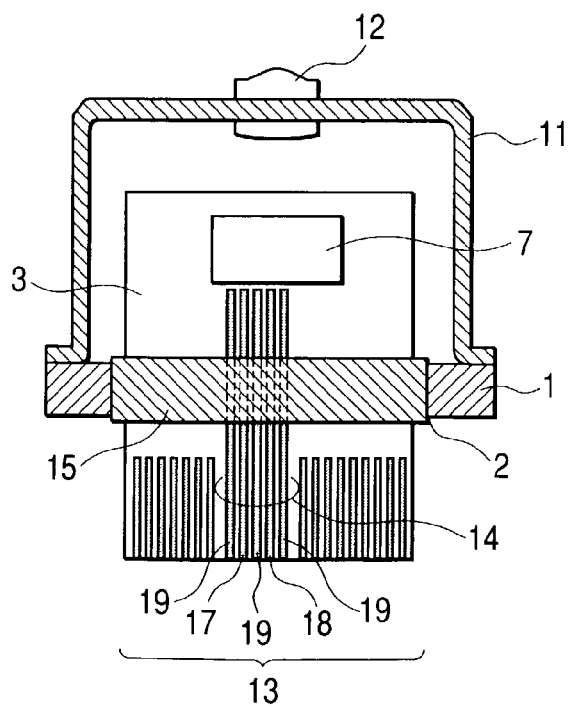
Figure 6C:
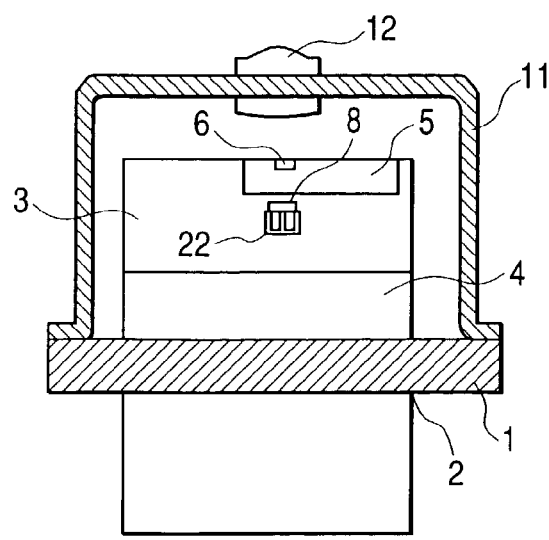

FIGS. 6A, 6B, 6C respectively illustrate a structure of a fourth embodiment of the optical communication module of the present invention. FIG. 6A is a cross-sectional view of FIG. 6A observed from the direction B. This embodiment is a transmitting optical communication module including a laser diode. The driver LSI 7, laser diode carrier 5, laser diode 6, monitor photodiode 8, monitor photodiode carrier 22 or the like are disposed on the front and rear surfaces of the ceramic substrate 3. Loading of these components on the ceramic substrate 3 can be realized with the soldering process, for example, of gold-tin or tin-silver alloy or with the fixing by the bonding agent such as a silver-epoxy-based bonding agent. Since the light emitting/photosensitive element and electronic components are allocated to both surfaces of the ceramic substrate, the ceramic substrate 3 can be reduced in size in comparison with the layout of only on the single surface. Thereby, the can-stem 1 can also be reduced in diameter. Electrical connection between the driver LSI 7 and laser diode 6 is carried out, for example, via a through-hole provided on the ceramic substrate 3. Connection via the through-hole realizes that the distance between the driver LSI 7 and laser diode 6 becomes near and thereby an impedance can also be reduced to realize impedance matching in the necessary frequency band. >Here, in order to acquire the transmission characteristic, it is also possible that energy loss of signal and unwanted radiation of signal to external circuit are controlled by allocating, as required, the grounded through-hole in the periphery of the through-hole for transmission of high frequency signal.

Figure 7A:
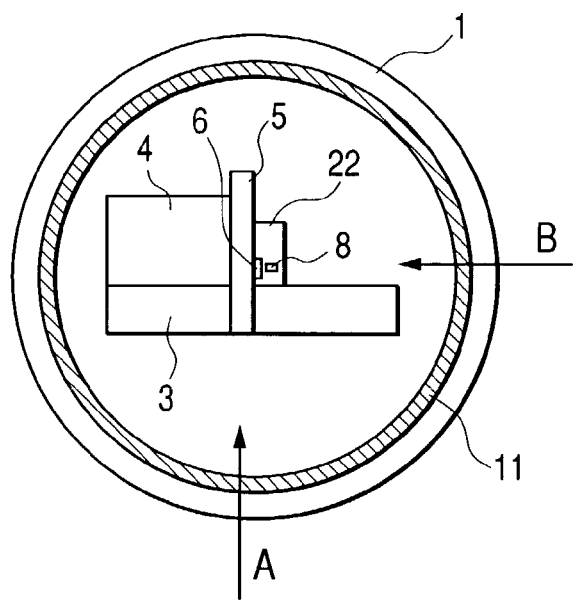
FIGS. 7A, 7B, 7C respectively illustrate a structure of a fifth embodiment of the optical communication module of the present invention.
Figure 7B:
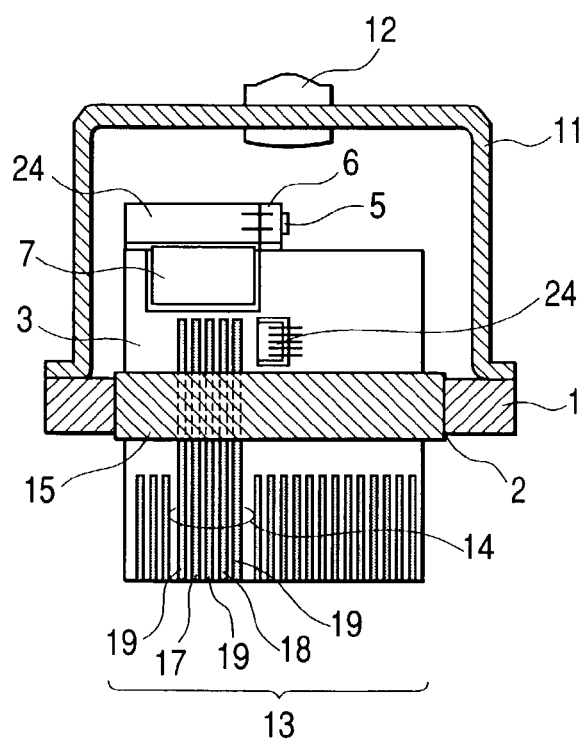
Figure 7C:
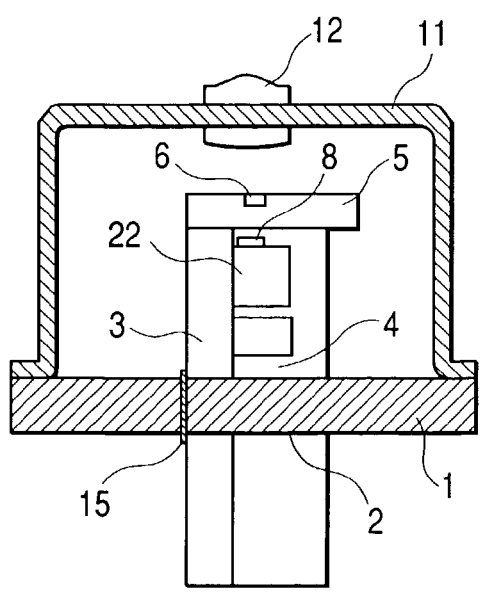

FIGS. 7A, 7B, 7C respectively illustrate a structure of a fifth embodiment of the optical communication module of the present invention. FIG. 7A is a plan view, FIG. 7B is a cross-sectional view of FIG. 7A observed from the direction A and FIG. 7C is across-sectional view of FIG. 7A observed from the direction B. This embodiment is a transmitting optical communication module including a laser diode. The driver LSI 7 is disposed on the metal stem 4. However, when the conditions for heat radiation are satisfied, the drive LSI 7 may also be disposed on the ceramic substrate 3. On the other hand, the laser diode carrier 5, monitor photodiode carrier 22 or the like are allocated on the metal stem 4 orthogonal to the plane of the metal stem 4 where the driver LSI 7 is provided. Loading of these components on the metal stem 4 is realized with the solder process, for example, of gold-tin, tin-silver alloy or with the fixing by the bonding agent such as a silver-epoxy-based bonding agent. Electrical connection of the driver LSI 7 and laser diode 6 can be realized by the wire bonding or ribbon bonding between the metallized pattern on a relay substrate 24 and the metallized pattern at the side surface of the laser diode carrier 5. Structures of the insulation layer 15, external electrode 13, operation signal wirings 17, 18, grounded wiring 18 and insulation layer 15 are identical to those in the other embodiments and the identical explanation is not repeated here.

The ceramic substrate 3 can be reduced in size through the layout of components explained above in comparison with the layout of such optical element and electronic components only on the single surface of the ceramic substrate 3. Therefore, the can-stem 1 can also be reduced in the diameter. The present invention is not limited to above embodiments and allows the loading of the other optical elements and electronic components within the can.

Figure 8A:
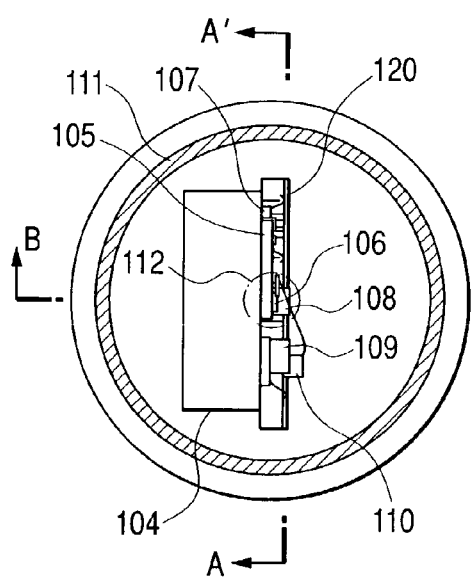
FIGS. 8A, 8B, 8C respectively illustrate a structure of a sixth embodiment of the optical communication module of the present invention.
Figure 8B:
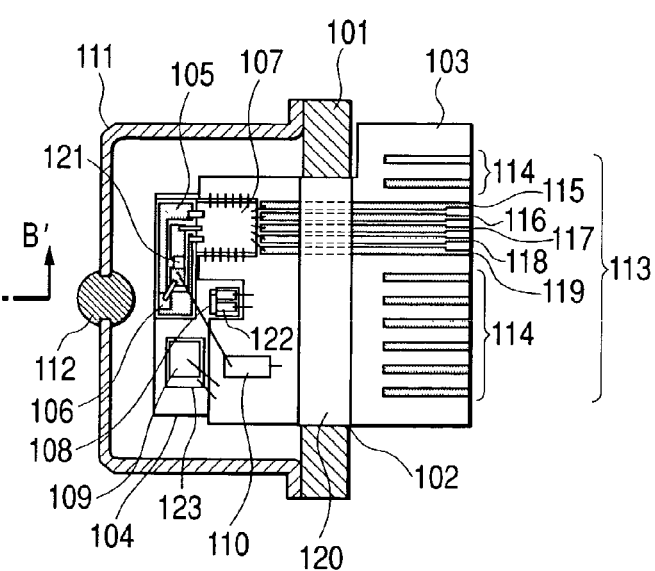
Figure 8C:
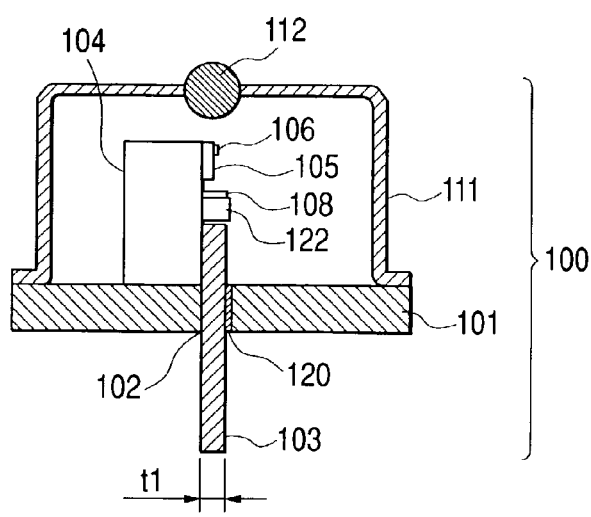

FIGS. 8A, 8B, 8C respectively illustrate a six embodiment of the optical communication module of the present invention.

FIG. 8A is a plan view, FIG. 8B is a cross-sectional view of FIG. 8A along the line A–A' and FIG. 8C is a cross-sectional view of FIG. 8A along the line B–B'. The transmitting optical communication module illustrated in the figure includes a laser diode. The wired ceramic substrate 103 is fixed through the disc type can-stem 101. Moreover, the metal stem 104 is disposed at the upper surface of the can-stem 101 and is fixed. The laser diode carrier 105, laser diode 106, driver LSI 107, monitor photodiode 108, thermistor 109 and inductor 110 for bias terminal, etc. are disposed and fixed on the surface parallel to the optical axis of the metal stem 104. On the upper surface of can-stem 101, the can-cap 111 is fixed. A lens 112 is fixed at the center of the upper surface of the can-cap 111.

Next, individual portions are explained in detail. The disc type can-stem 101 is a metal stem made of cover or the like and is provided with a substrate through-hole 102 through which the ceramic substrate 102 is provided previously. The ceramic substrate 103 is made of alumina or aluminum nitride and is provided with a wiring required as the electric circuit, an electrode for wire bonding (details are not illustrated) and an external electrode 113 required for connection with the external side of the module. The wiring format is formed by the printing of paste such as tungsten or by the burning. Moreover, through-holes are also formed as required and thereby the ceramic substrate 103 is completed as a multilayer wiring substrate. The electrode for wire bonding and the external electrode 113 are also provided with the plating of Ni/Au over tungsten or the like. A metallized layer of tungsten/Ni/Au is formed to the entire part of the circumference of the part of the ceramic substrate 103 which is fixed in the substrate through-hole 102 and such fixing part is fixed in the substrate through-hole 102 to the can-stem 101 with the silver-alloy brazing method. On the wiring forming surface of the ceramic substrate, the insulation layer 120 (alumina) is provided. As explained above, the connecting part of the can-stem 101 and ceramic substrate 103 is hermetically sealed.

The metal stem 104 is made of a metal material having the large thermal conductivity (200 W/(m·K)) such as a copper-tungsten alloy and the thermal expansion coefficient (5 to $7_o \cdot 10^{-6}/_o$) which is identical to that of the covar of can-stem 101 and alumina or aluminum nitride of the ceramic substrate 103 and is fixed to the can-stem 101 with the silver-alloy brazing method. The metal stem 104 of copper-tungsten alloy effectively conductively leaks the heat generated by the driver LSI 107 to the can-stem 101. The laser diode carrier 105 is loaded on the surface parallel to the optical axis of the metal stem 104. This loading is realized, for example, by the soldering process of gold-tin or tin-silver alloy or the like. The laser diode carrier 105 is a ceramic substrate made of aluminum nitride or the like and is provided with the impedance matching resistor 121. The impedance matching resistor 121 is formed, for example, of a thin film resistor of nickel chromium or a chip resistor formed on the laser diode carrier 105. The laser diode 106 is loaded on this laser diode carrier 105. This loading is realized by the soldering process, for example, of the gold-tin or tin-silver alloy or the like. Here, the metal stem 104, laser diode carrier 105 and laser diode 106 are positioned so that the laser diode 106 emits the signal beam toward the lens 112 and the center of light emission is located to the center of the disc type scan-stem 101. When the impedance matching resistor 121 is not required, it is possible that the laser diode 106 is loaded in direct to the metal stem 104 without use of the laser diode carrier 105.

The driver LSI 107 to drive the laser diode 106 is loaded on the metal stem 104 as near as possible to the laser diode carrier 105. This loading is realized with the soldering process of the gold-tin or tin-silver alloy or with the fixing by the bonding agent such as a silver-epoxy-based bonding agent. In this embodiment, the driver LSI 107 is provided with 17 terminals and the driver LSI 107 can be provided nearer to the laser diode 106 and the 17 wirings can be guided to the external side of the can by introducing the structure that the ceramic substrate 103 is provided through the can-stem 101 as explained above. In the figure, eight wirings 114 are illustrated for simplifying the figure.

The monitor photodiode 108 is loaded previously on the monitor photodiode carrier 122 and its photosensitive surface is located at the position to receive the laser beam emitted from the rear side of the laser diode 106. Loading of the monitor photodiode 108 to the monitor photodiode carrier 122 and loading of the monitor photodiode carrier 122 to the metal stem 104 are realized, for example, with the soldering process of gold-tin or tin-silver alloy. On the monitor photodiode carrier 122, the surface for loading the monitor photodiode 108 is formed and a wiring is also formed at the surface parallel to the front surface of the ceramic substrate 103.

The thermistor 109 for monitoring temperature of the laser diode 106 is loaded to the thermistor carrier 123 made of alumina nitride in order to attain electrical insulation from the metal stem 104 and the thermistor carrier 123 is allocated on the metal stem 104 near the laser diode 106. Loading of the thermistor 109 to the thermistor carrier 123 and loading of the thermistor carrier 123 to the metal stem 104 are realized, for example, with the soldering process of gold-tin or tin-silver alloy. The thermistor 109 may also be loaded on the laser diode carrier 105. Moreover, in this embodiment, the inductor 110 for preventing the leak of the high frequency signal of the laser diode 106 to the external circuit from the bias terminal for giving the bias potential of the laser diode 106 loaded on the ceramic substrate 103. Loading of this inductor 110 on the ceramic substrate 103 is realized, for example, with the soldering process of gold-tin or tin-silver alloy. Each component is electrically connected with the wire bonding or ribbon bonding method.

Meanwhile, the cylindrical can-cap 111 is formed of a material same as the can-stem 101 such as cover and the center area of the upper surface is opened and is sealed with the lens 12 using a glass material. In this embodiment, as the lens 112, an aspherical lens with less spherical aberration is used to attain higher optical coupling efficiency between the laser beam from the laser diode 106 and an optical fiber (not illustrated) to receive this laser beam but when a laser beam power is enough, a low price ball leans may also be used. The can-cap 111 is mounted to the can-stem 101 for matching between the center of light emission of the laser diode 106 and the center of leans 112. In this method, under the condition that the can-cap 111 is overlapped, for example, on the can-stem 101, the optimum position of the can-cap 111 on the can-stem 101 is obtained while the laser diode 106 emits the laser beam and a laser beam power emitted from the lens 112 is measured and the can-cap 111 and the can-stem 101 are welded in the ring shape with the resistance welding method. Moreover, when the structure that the lens 112 is mounted to the external side of the can module is introduced, a glass plate (not illustrated) may also be fitted to the opening at the center of the upper surface of the can-cap 111. In this case, hermetical sealing is not always required depending on the required reliability and sealing by a bonding agent is also permitted.

Figure 9:
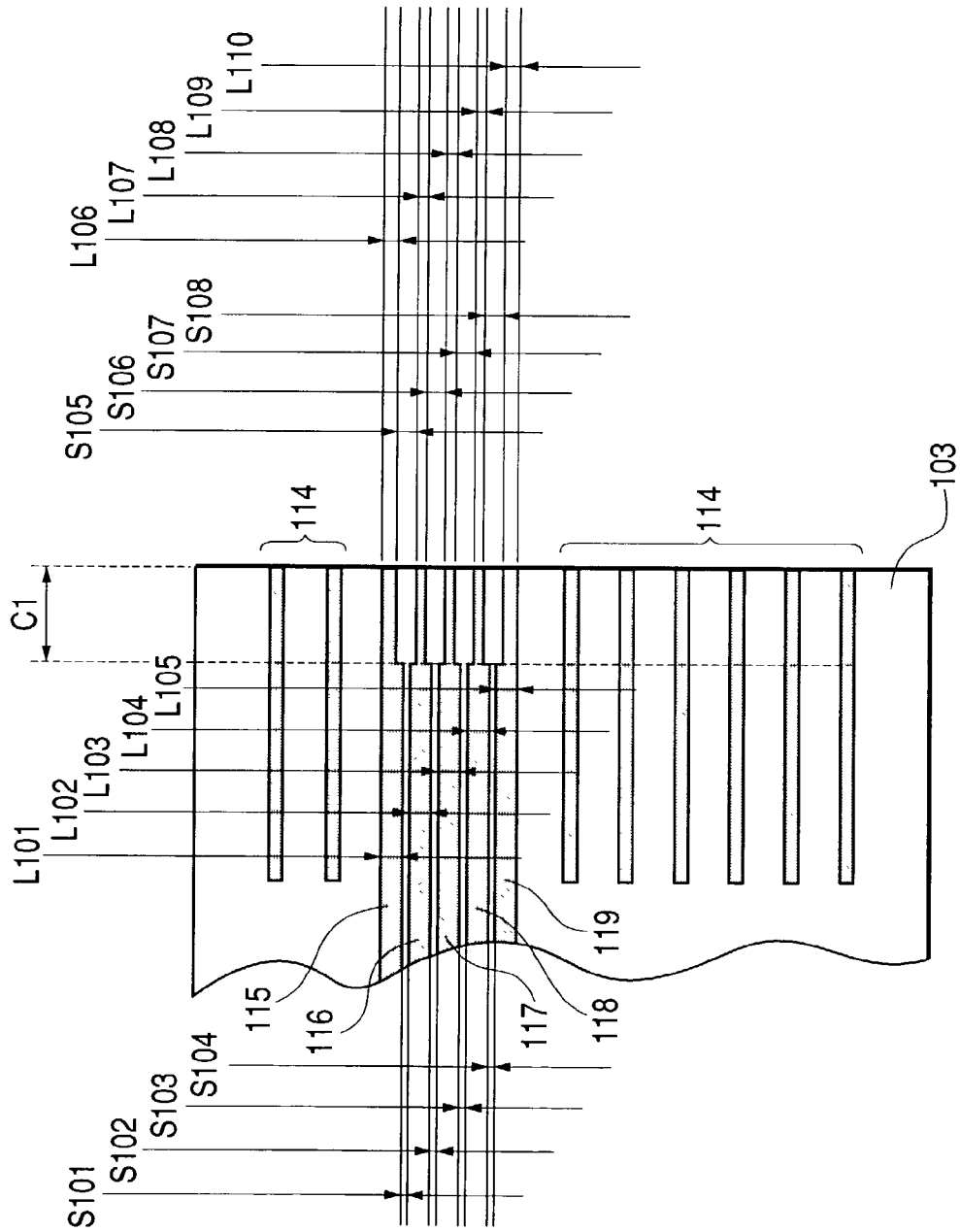
FIG. 9 is a plan view showing an embodiment of an external electrode of the ceramic substrate of FIGS. 8A, 8B, 8C.

FIG. 9 is a plan view illustrating an embodiment of the external electrode of the ceramic substrate of FIG. 8. The high speed signal transmission wirings 115 to 119 on the ceramic substrate 103 are formed in the co-planer structure and are respectively composed of two differential signal wirings 116 and 118 as the signal wirings for transmitting the signals in the inverted polarities with each other. With this differential signal transmission system, energy loss of signal and unwanted radiation to the external side can be controlled. The grounded wirings 115, 117, 119 are formed in both sides of the differential signal wirings 116 and 118 and between both wirings. The wiring widths L101 to L105 and wiring intervals S101 to S104 of the high speed signal transmission wirings 115 to 119 are determined depending on the parameters of thickness t1 and dielectric constant of the ceramic substrate 103 and thickness (not illustrated) and conductivity of tungsten as a material of the high speed signal transmitting wirings 115 to 119 and these are adjusted in the relationship to obtain the characteristic impedance of wiring of about 50Ω(usually, 50±2Ω, hereinafter this value is defined as about 50Ω). Moreover, the high speed signal transmission wirings 115 to 119 are provided with a connecting point C1 for solder connection with a flexible wiring substrate explained later at the end part of the ceramic substrate 103. The wiring widths L106 to L110 and wiring intervals S105 to S108 of the high speed signal transmission wirings 115 to 119 at the connecting point C1 are different in the design from the region other than the connecting point C1. The wiring widths L106 to L110 and wiring intervals S105 to S108 of the connecting point C1 are determined considering thickness t1 and dielectric constant of the ceramic substrate 103, thickness (not illustrated) and conductivity of tungsten as a material of the high speed signal transmission wirings 115 to 119 and physical characteristic values of solder used for connection with a flexible substrate explained later and physical characteristic values of wiring and dielectric material forming the flexible substrate and these values are adjusted in the relationship to provide the characteristic impedance of about 50Ω of the wiring at the connecting point C1 when the flexible substrate is connected.

Figure 10A:
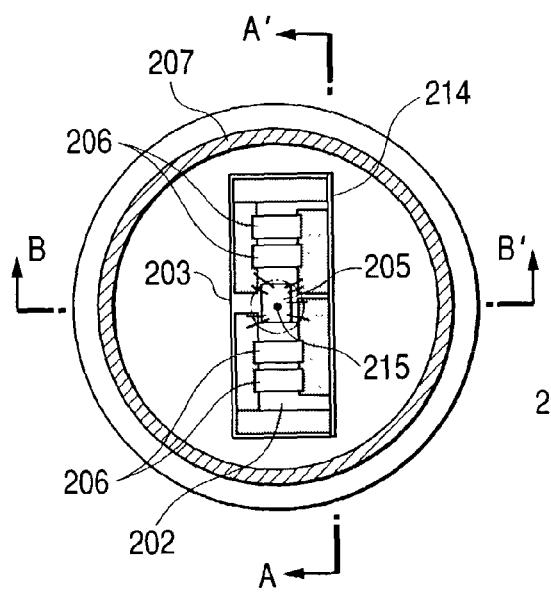
FIGS. 10A, 10B, 10C respectively illustrate a structure of a seventh embodiment of the optical communication module of the present invention.
Figure 10B:
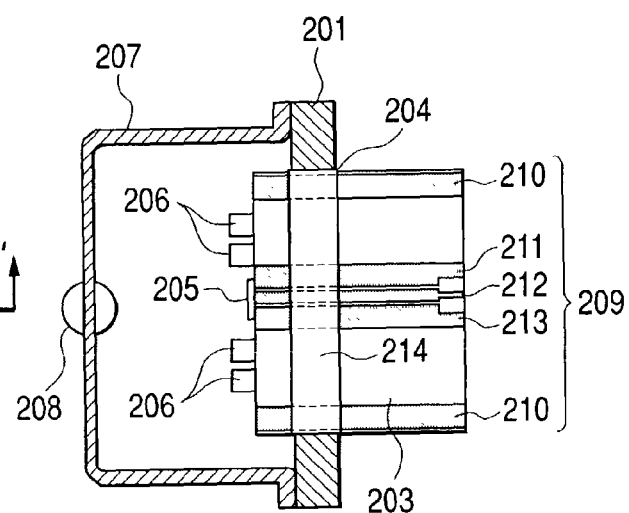
Figure 10C:
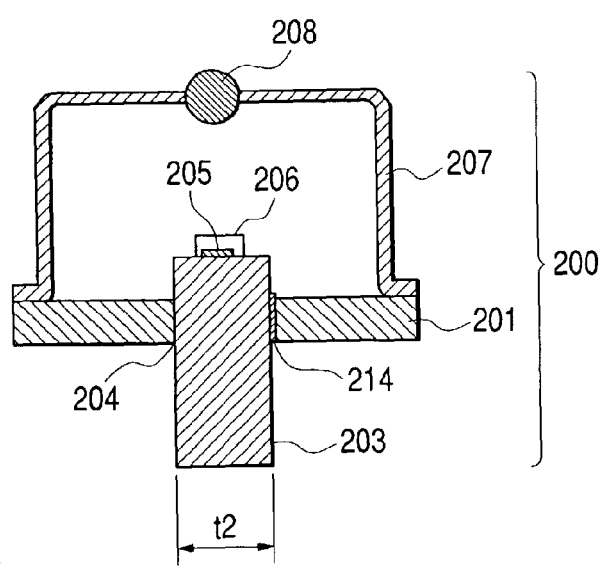

FIGS. 10A, 10B, 10C respectively illustrate a structure of a seventh embodiment of the optical communication module of the present invention. FIG. 10A is a plan view, FIG. 10B is a cross-sectional view of FIG. 10A along the line A–A' and FIG. 10C is a cross-sectional view of FIG. 10A along the line B–B'. The optical communication module of this embodiment is a receiving optical communication module loading a photo diode. In FIG. 10, an Opto-Electronic IC (OEIC) integrating a photodiode and a preamplifier is used as an element having the function of photodiode. First, the total structure will be explained. The wired ceramic block 203 is fixed through the ceramic block through-hole 204 of the disc type can-stem 201. The OEIC 205 is loaded on the OEIC loading plane 202 crossing vertically or obliquely the optical axis of the ceramic block 203. Moreover, on the OEIC loading plane 202, the capacitor 206 for stabilizing the power supply voltage of the OEIC 205 is allocated near the OEIC 205. The can-cap 207 is fixed on the supper surface of the can-stem 201. Moreover, the lens 208 is also fixed to the center of the upper surface of the can-cap 207.

Next, individual portions will be explained in detail. The disc type can-stem 201 is a metal stem made of cover or the like wherein the ceramic block through-hole 204 is formed previously through the ceramic block 203. The ceramic block 203 is made of alumina or aluminum nitride or the like and is provided with wiring required as an electric circuit, an electrode for wire bonding and an external electrode 209 required for connection with external circuit of module. The wiring is formed by printing of paste such as tungsten or by the burning and the wiring on the photodiode loading plane 202 and the wirings 210 to 213 on the external electrode forming plane are connected at the line where both surfaces are crossing. Namely, the wiring of the ceramic block 203 is formed only on the surface of ceramic block 203. The wire bonding electrode and external electrode 209 are provided with the plating of Ni/Au on tungsten or the like. As a material of ceramic substrate 103, mullite and glass ceramics or the like may be used in addition to those explained above. Otherwise, it is also possible to use a dielectric material such as zirconia glass.

The insulation layer 214 (alumina) is provided at the part of the ceramic block 203 fixed at the block through-hole 204 and a metallized layer for stem junction of tungsten/Ni/Au is formed to the entire circumference of the ceramic block 203 (part fixed to the block through-hole 35) including the surface of insulation layer 214. This metallized layer is then fixed to the can-stem 201 with the silver alloy brazing method. As explained above, the connecting point of the can-stem 301 and ceramic block 203 is hermetically sealed.

Loading of the OEIC 205 to the OEIC loading plane 202 is realized, for example, with the soldering process of gold-tin and tin-silver alloys or with the fixing by the bonding agent such as a silver-epoxy-based bonding agent. The positions of ceramic block 203 and OEIC 205 are determined to attain the matching between the center of the photosensitive surface of the photodiode 215 built in the OEIC 205 and the center of the disc type can-stem 201. In FIG. 10, low noise and high speed signal transmission has been realized using the OEIC 205 integrating the photodiode and preamplifier and the signal wiring 212 of which characteristic impedance is matched with about 50 Ω. In both sides of the signal wiring 212, the grounded wirings 211 and 213 are allocated. Two wirings 210 are required to supply the power source voltage to the OEIC 205 and therefore five wirings are guided to the external side of can, in addition to the signal wirings 211 to 213. When it is required to guide the more wirings to the outside of the can, such as the case where the signal wirings of OEIC 205 are operated for signal transmission, the receiving module of the structure explained here can satisfy the above requirements. The OEIC 205 is connected to the wiring within the can by the wire bonding or ribbon bonding.

Meanwhile, the cylindrical can-cap 207 is formed of a material which is same as that of can-stem 201 such as covar and the center area of the upper surface is opened and sealed with the lens 208 using a glass material. In FIG. 10, a low price ball lens is used as the lens 12 but it is also possible to use a higher performance aspherical lens or the like depending on the performance required. The can-cap 207 is mounted to the can-stem 201 for matching between the center of the photosensitive surface of the photodiode 215 built in the OEIC 205 and the center of the lens 208. In this method, under the condition that the can-cap 207 is overlapped on the can-stem 201, the optimum position of the can-cap 207 on the can-stem 201 is obtained by guiding the laser beam from the external side to the photodiode 215 via the lens 208 and then measuring the photosensitive power of the photodiode 215 and the can-cap 207 and can-stem 201 are welded in the ring shape by the resistance welding method. Moreover, when the structure that the lens 208 is mounted in separation from the can module 200 is introduced, a glass plate (not illustrated) may be fitted to the opening at the center of the upper surface of the can-cap 207. In this case, the hermetical sealing is not always limited depending on the reliability of requirement and the sealing by the bonding agent is also permitted.

Figure 11:
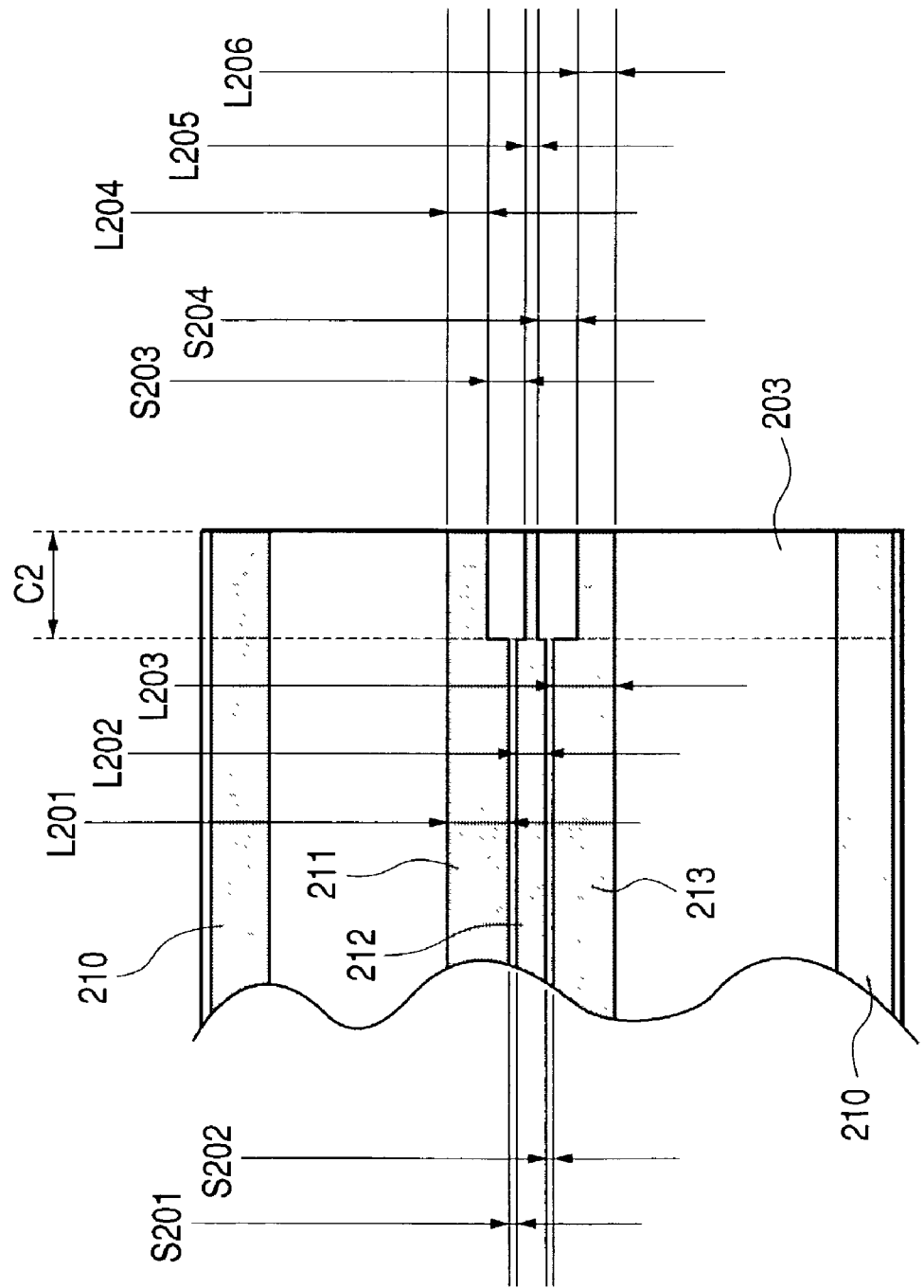
FIG. 11 is a plan view showing an external electrode on the ceramic block of FIG. 10.

FIG. 11 is a plan view of the external electrode on the ceramic block of FIG. 10. The high speed signal transmission wirings 211 to 213 on the ceramic block 203 are formed in the co-planer structure and is composed of the signal wiring 212 and the grounded wirings 211, 213 in both sides thereof. The wiring widths L201 to L203 and wiring intervals S201, S202 of the high speed signal transmission wirings 211 to 213 are determined depending on the parameters such as thickness t2 and dielectric constant of the ceramic block 203 and thickness (not illustrated) and conductivity of tungsten as a material of the high speed signal transmission wirings 211 to 213 and these parameters are adjusted in the relationship providing the characteristic impedance of wiring of about 50 Ω. Moreover, the high speed signal transmission wirings 211 to 213 are provided, at the end part of the ceramic block 203, with the connecting point C2 for solder connection with a flexible wiring substrate explained later. The wiring widths L204 to L206 and wiring intervals S203, S204 of the high speed signal transmission wirings 211 to 213 at the connecting point C2 are different in design from that of the region other than the connecting point C2. The wiring widths L204 to L206 and wiring intervals S203, S204 at the connecting point C2 are determined considering the thickness t2 and dielectric constant of the ceramic block 203, thickness (not illustrated) and conductivity of tungsten as a material of the high speed signal transmission wirings 211 to 213, physical characteristic values of solder used for connection with a flexible substrate explained later and physical characteristic values of the wiring and dielectric material forming the flexible substrate, and these are adjusted to the relationship for providing the characteristic impedance of wiring of about 50Ω at the connecting point C2 when the flexible substrate is connected.

Figure 12A:
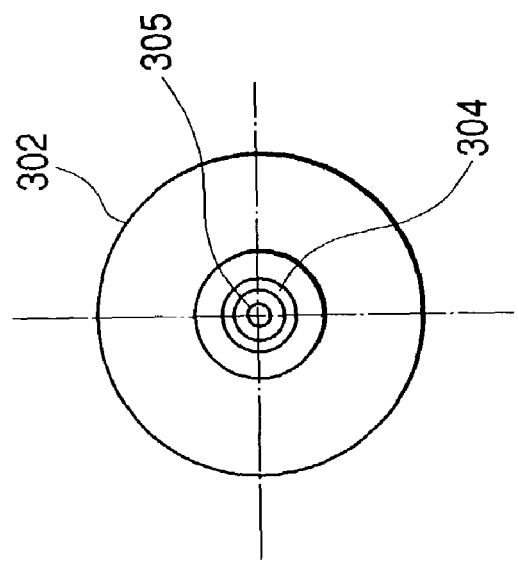
FIGS. 12A, 12B respectively illustrate an embodiment of a transmitting optical system module storing the transmitting optical communication module of FIG. 8.
Figure 12B:
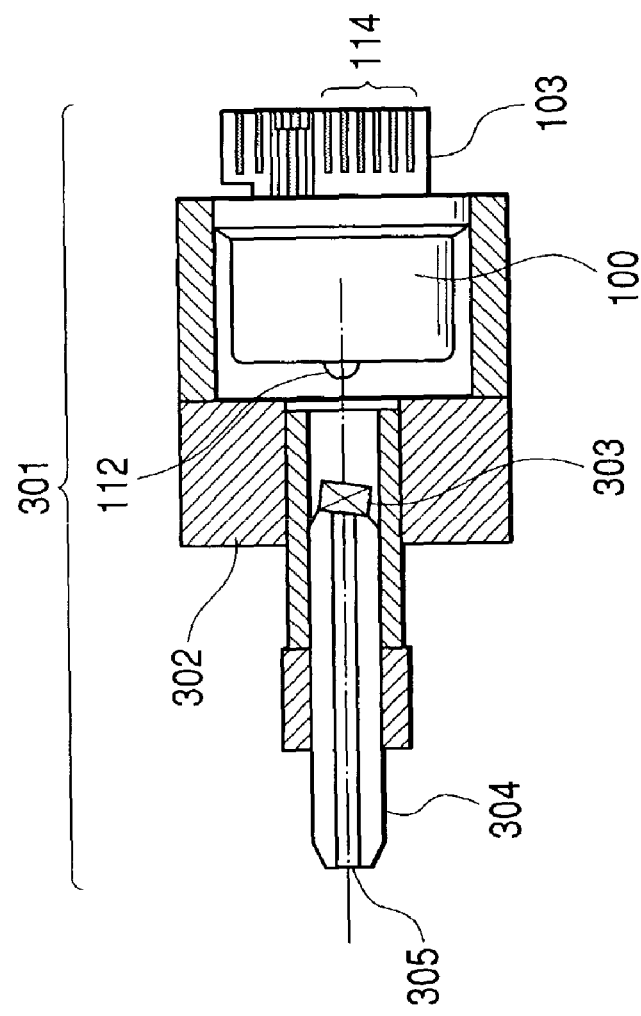

FIGS. 12A, 12B respectively illustrate a structure of an embodiment of the transmitting optical system module storing the transmitting optical communication module of FIG. 8. FIG. 12A is a front elevation diagram and FIG. 12B is a partial side elevation diagram of the cross-section view. A case 302 consisting of a plurality of structural components made of the stainless steel has a structure integrating a fiber capillary 304 for guiding the laser beam emitted from the lens 112 of the transmitting module 100, an isolator 303 for preventing reflection of the laser beam inputted to the fiber capillary 304 and the transmitting module 100.

The structural components of the case 302 and transmitting module 100 are all connected by the welding but the transmitting module 100 is welded and fixed to the case 302 after the positioning to provide the result that the laser beam emitted from the lens 112 of the transmitting module 100 is finally incident to the core 305 at the center of fiber capillary 304 in the highest efficiency. This positioning is carried out while intensity of the laser beam (not illustrated) guided and emitted by the fiber capillary 305 is monitored with a power meter or the like (not illustrated) provided additionally after a pseudo signal for lighting the laser diode is inputted to the wiring 114 on the ceramic substrate 103. The transmitting module 100 and the internal space of the case 302 sealed with the fiber capillary 305 are filled with a kind of inert gas.

Figure 13B:
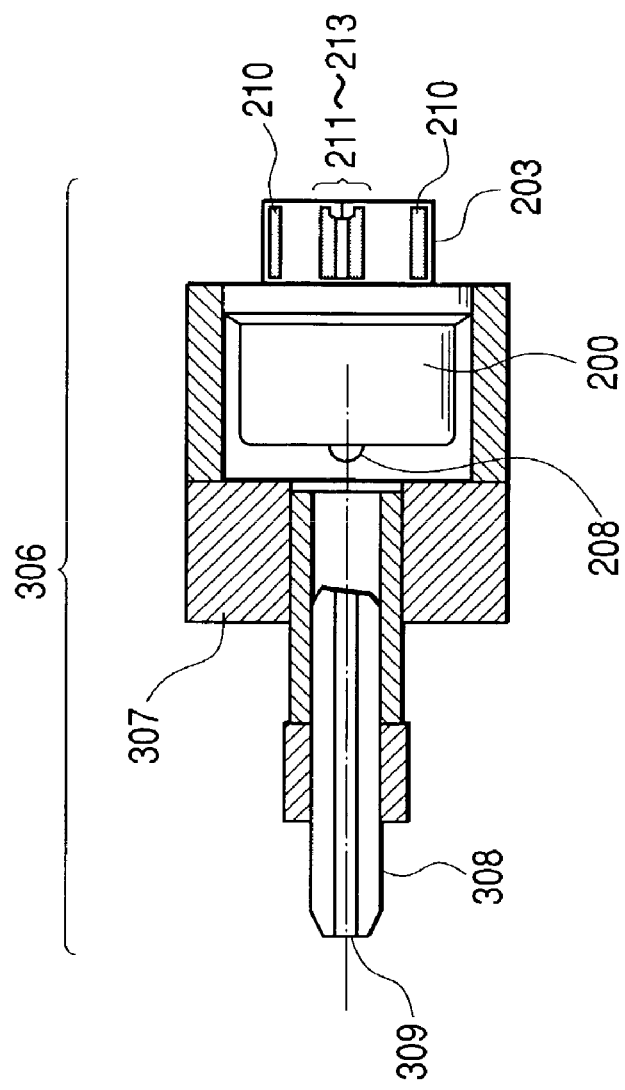
FIGS. 13A, 13B respectively illustrate a structure of an embodiment of a receiving optical system module storing the receiving communication module of FIG. 10.
Figure 13A:
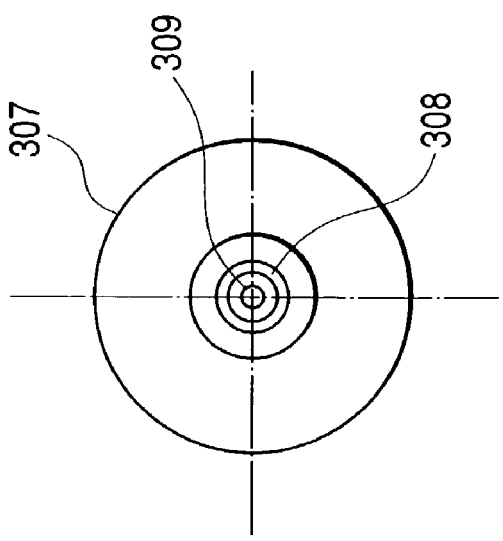

FIGS. 13A, 13B respectively illustrate a structure of an embodiment of the receiving optical system module storing the receiving optical communication module of FIG. 10. FIG. 13A is a front elevation diagram and FIG. 13B is a partial side elevation diagram of the cross-section view. The case 307 consisting of a plurality of structural components made of stainless steel integrates the fiber capillary 308 for guiding the laser beam (not illustrated) inputted from the external side of the receiving module 306 and the receiving module 200. The structural components of the case 307 and receiving module 200 are all connected with the welding process but the receiving module 200 is welded and fixed to the case 200 by finally positioning the photodiode within the receiving module 200 to detect, in the highest efficiency, the laser beam emitted from the core 309 at the center of fiber capillary 308 via the lens 208. Under this positioning, a detected signal of the photodiode in the receiving module 200 is adjusted while it is detected with the signal wirings 211 to 213 on the ceramic substrate 203 by inputting the laser beam to the core 309 of the fiber capillary 308 from the external side of the receiving optical system module 306 after a voltage for operating the photodiode is impressed to the wiring 210 on the ceramic substrate 203. The receiving module 200 and the internal space of case 307 sealed with the fiber capillary 308 are filled with a kind of inert gas.

FIGS. 14A, 14B, 14C respectively illustrate a mounting structure of an embodiment of the receptacle type optical communication module (transceiver module) including the transmitting and receiving functions. FIG. 14A is a partial plan view of the cross-section, FIG. 14B is a cross-sectional view of FIG. 14B along the line A–A' and FIG. 14C is a cross-sectional view of FIG. 14A along the line B–B'. This optical communication module has the structure wherein a transmitting optical system module 301 comprising the transmitting module 100, a receiving optical system module 306 comprising the receiving module 200, a printed circuit board 600 mounting a control circuit of both optical systems modules and a receptacle 602 for connecting an optical fiber from the external side to the transmitting/receiving optical system module are accommodated within one cabinet 601. The printed circuit board 600 is provided with a connector board 630 and a plurality of optical communication modules may be used through insertion to a connector engaging part provided on a sheet of mother board (not illustrated). The connector board 630 is provided with a wiring 631 for supply the power source to the printed circuit board 600 from the mother board and for exchange of the signals between them. The wiring 631 is laid using a copper wire and the surface thereof is provided with the plating of gold at the surface thereof.

The receptacle 602 realizes an optical coupling for controlling loss in amount of laser beam because the external shape of fiber capillary of the transmitting/receiving optical system module is restricted with a sleeve 69 and the fiber capillary (not illustrated) at the end part of connected to be inserted to the transmitting/receiving side from the external side of the optical communication module is inserted with pressure into the sleeve 609.

Figure 15A:
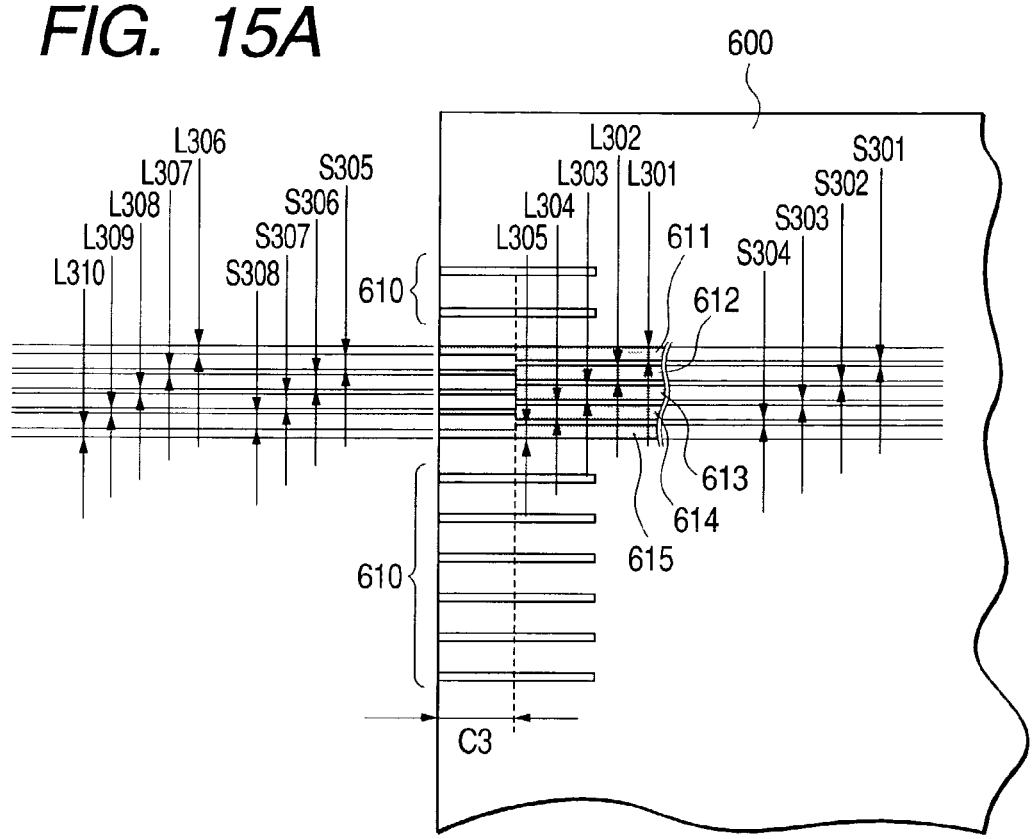
FIGS. 15A, 15B respectively illustrate an embodiment of a wiring pattern provided over a printed circuit board of FIG. 14.
Figure 15B:
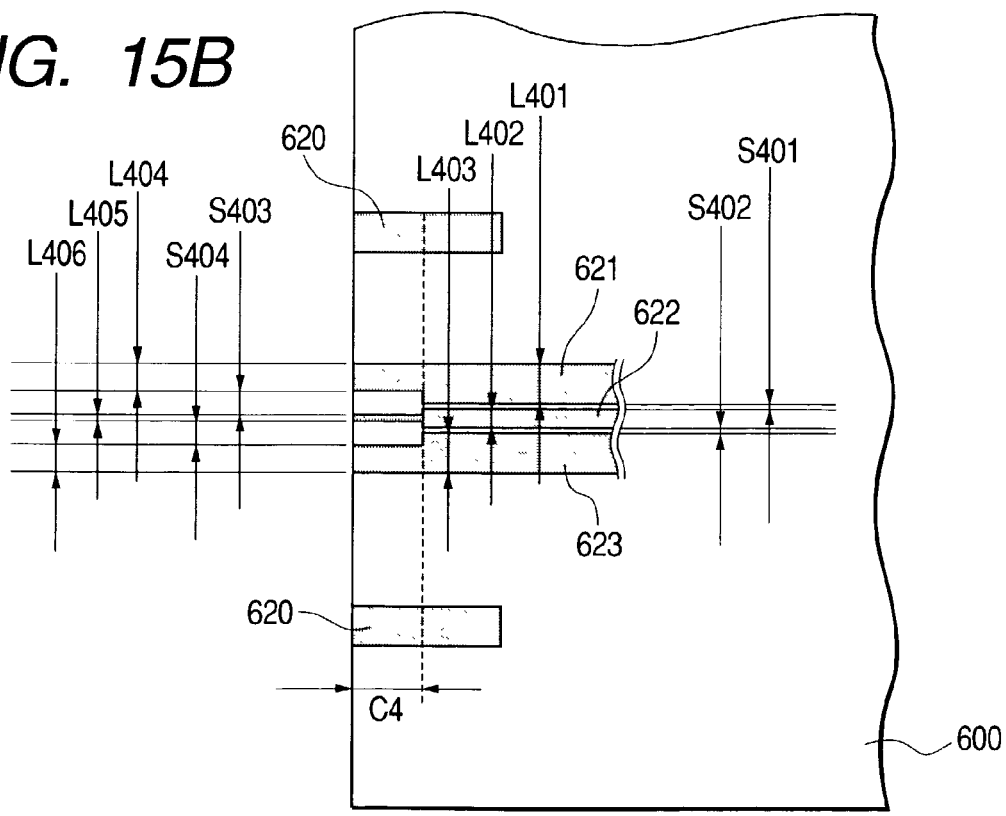

FIGS. 15A, 15B respectively illustrate an embodiment of a wiring pattern provided on the printed circuit board of FIG. 14. FIG. 15A is a plan view of the wiring pattern in the transmitting optical system side and FIG. 15B is a plan view of the wiring pattern in the receiving optical system side provided on the printed circuit board. The high speed signal transmission wirings 611 to 615 on the printed circuit board 600 are formed in the co-planer structure and are consisting of two wirings of the differential signal wirings 612 and 614 as the signal wirings for transmitting the signals having the polarities inverted with each other. With this differential signal transmission system, energy loss of signal and unwanted radiation to the external circuit can be controlled. The grounded wirings 611, 613, 615 are formed in both sides of the differential signal wirings 612 and 613 and in the area between both differential signal wirings. The wiring widths L301 to L305 and wiring intervals S301 to S304 of the high speed signal transmission wirings 611 to 615 are determined depending on the parameters such as thickness and dielectric constant of the printed circuit board 600 and thickness (not illustrated) and conductivity of copper as a material of the high speed signal transmission wirings 611 to 615 and these parameters are adjusted to the relationship to attain the characteristic impedance of wiring of about 50Ω. Moreover, the high speed signal transmission wirings 611 to 615 are provided with a connecting point C3 for solder connection with a flexible wiring board explained later at the end part of the printed circuit board 600. The wiring widths L306 to L310 and the wiring intervals S305 to S308 of the high speed signal transmission wirings 611 to 615 at the connecting point C3 are different in design from that of the region other than the connecting point 3C. The wiring widths L306 to L310 and wiring intervals S305 to S308 at the connecting point 3C are determined considering the thickness and dielectric constant of the printed circuit board 600, thickness of copper as a material of the high speed signal transmission wirings 611 to 615 and conductivity thereof, physical characteristic values of solder used for connection with a flexible substrate explained later and physical characteristic values of wiring and dielectric material forming the flexible substrate and these values are adjusted to the relationship to provide the characteristic impedance of the wiring of about 50Ω when the flexible substrate is connected. The wiring 610 is a signal line for controlling the laser diode stored in the transmitting module 100.

FIG. 15B is a plan view of a wiring pattern in the receiving optical system side provided over the printed circuit board 600. The high speed signal transmission wirings 621 to 623 on the printed circuit board 600 is formed in the co-planer structure and is composed of the signal wiring 622 and the grounded wirings 621, 623 in both sides of the signal wiring. The wiring widths L401 to L403 and wiring intervals S401, S402 of the high speed signal transmission wirings 621 to 623 are determined depending on the parameters such as thickness and dielectric constant of the printed circuit board 600 and thickness and conductivity of copper as a material of the high speed signal transmission wirings 621 to 623 and these parameters are adjusted to the relationship providing the characteristic impedance of wiring of about 50Ω. Moreover, the high speed signal transmission wirings 621 to 623 is provided, at the end part of the printed circuit board 600, with a connecting point C4 for solder connection with a flexible wiring board explained later. The wiring widths L404 to L406 and wiring intervals S403, S404 of the high speed signal transmission wirings 621 to 623 at the connecting point C4 are different in the design from the region other than the connecting point C4. The wiring widths L404 to L406 and wiring intervals S403, S404 at the connecting point C4 are determined considering thickness and dielectric constant of the printed circuit board 600, thickness (not illustrated) and conductivity of copper as a material of the high speed signal transmission wirings 621 to 623, physical characteristic values of solder used for connection with a flexible substrate explained later and physical characteristic values of wiring and dielectric material forming the flexible substrate and these are adjusted to the relationship providing the characteristic impedance of wiring of about 50Ω when the flexible substrate is connected. The wiring 620 is provided to supply the power source to the photodiode stored within the receiving module 200.

As is explained with reference to FIG. 14, the transmitting optical system module 301 and receiving optical system module 306 are fixed within the cabinet 601 with reference to the mounting positions of the connectors 603 to 605 and 606 to 608 of the receptacle 602. Meanwhile, the printed circuit board 600 is fixed with screws to the predetermined position within the cabinet 60. In order to connect in direct the ceramic substrate 103 and printed circuit board 600 in the transmitting optical system module 301 and the ceramic block 203 and printed circuit board 600 in the receiving optical system module 306, it is required to precisely match the parallelism and orthogonality of the ceramic substrate 103, ceramic block 203 and printed circuit board 600 and thereby assembling cost of the optical communication module rises. If the direct connection is realized, an external force is applied to the connector board 630 of the printed circuit board 600 when the optical communication module is loaded on the other board (not illustrated) and therefore the external force is also transferred to the connecting point of the ceramic substrate 103 and printed circuit board 500 and the connecting point of the ceramic block 203 and printed circuit board 500 and thereby reliability of the connecting points is lost.

In the present invention, for the purpose of absorbing displacement of loading positional relation of the ceramic substrate 103 and the printed circuit board 600 in the side of the transmitting system optical module 301, the connecting point C1 on the ceramic substrate 103 and the connecting point C3 on the printed circuit board 600 in the transmitting optical system module 301 are electrically connected with an exclusive flexible wiring board 400 which can transmit the high speed signal (10 Gbit/sec or higher). In the same manner, the connecting point C2 on the ceramic block 203 and the connecting point C4 on the printed circuit board 600 in the side of the receiving optical system module 306 are also electrically connected with an exclusive flexible wiring board 500 which can transmit the high speed signal (10 Gbit/sec or higher).

FIGS. 16A, 16B, 16C respectively illustrate a first embodiment of a flexible wiring board. FIG. 16A is a plan view, FIG. 16B is a front elevation diagram and FIG. 16C is a cross-sectional view of the wiring of the flexible wiring board. This embodiment illustrates the flexible wiring board used in the transmitting optical communication module side loading a laser diode. All wirings are formed in the same structure of cross-section. The flexible wiring board 400 is provided with the wirings 401 to 406 (copper wirings in this embodiment) in the thickness of t3 (about 30 μm in this embodiment). At its upper and layer layers, a dielectric material layers 407 (polyimide in this embodiment) are laminated in the thickness of t4 (about 50 μm in this embodiment) and t5 (about 50 μm in this embodiment). As the material of the wirings 401 to 406, materials such as NiCr, AlW, Be, Pt, Au or a material combining these elements may be used in addition to copper. The high speed signal transmission wirings 401 to 405 are formed in the co-planer structure and is composed of two differential signal wirings 402 and 404 as the signal wirings to transmit the signals having the polarities inverted with each other. With this differential signal transmission system, energy loss of signal and unwanted radiation to external circuit may be control. The grounded wirings 401, 403, 405 are formed in both sides of the differential signal wirings 402 and 404 and between both signal wirings. The wiring widths L501 to L505 and wiring intervals S502 to S504 of the high speed signal transmission wirings 401 to 405 are determined depending on parameters such as thickness t4, t5 and dielectric constant of the dielectric material layers 407 laminated at the upper and lower sides of the high speed signal transmission wirings 401 to 405 and thickness t4 and conductivity of copper as a material of the high speed signal transmission wirings 401 to 405 and these values are adjusted to the relationship to provide the characteristic impedance of wiring of about 50Ω. In this embodiment, the widths L501 to L505 of the wirings 401 to 405 are about 200 μm and the wiring intervals S501 to S504 are about 100 μm. Since the wiring 406 is a signal line for controlling the laser diode stored in the transmitting module 100 to mainly transmit a DC signal, it is not required to consider the characteristic impedance of wiring for the width of wiring 406 and the interval between the wirings 406. The total length of the flexible wiring board is about 15 mm and total width thereof is about 8 mm.

At both ends of the flexible wiring board 400, a connecting point C5 to the connecting point C1 on the ceramic substrate 103 in the side of the transmitting optical system module 301 and a connecting point C6 to the connecting point C3 on the printed circuit board 600 are provided. On the wirings 401 to 406 of the connecting points C5 and C6 at both ends of the flexible substrate 400, the solder platings 401' to 406' and 401" to 406" are formed in the thickness of about 20 μm.

Figure 17A:
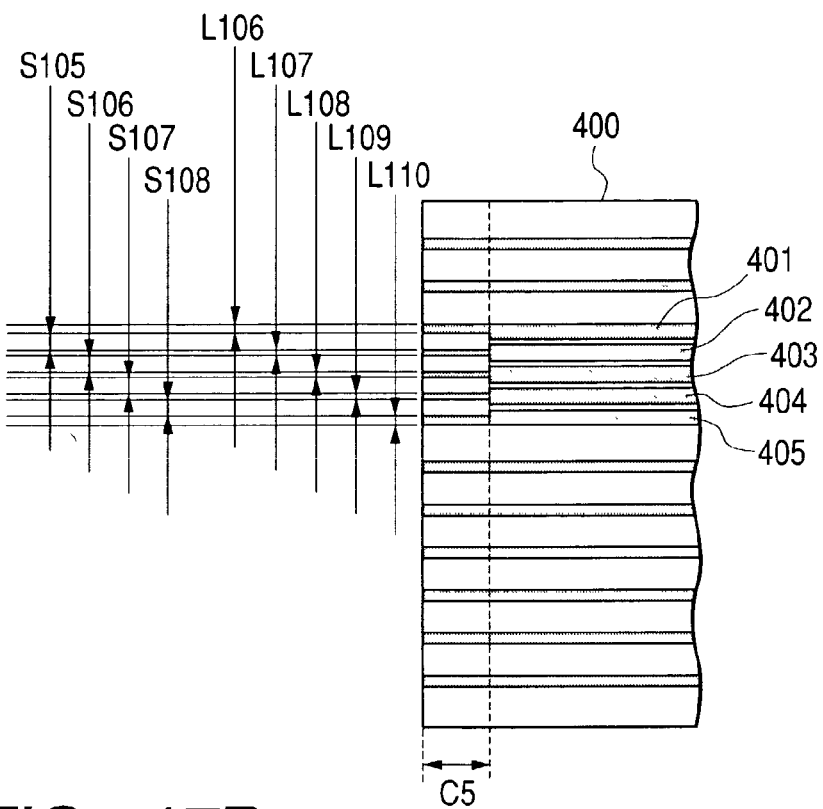
FIGS. 17A, 17B respectively illustrate an embodiment of a structure of the connecting points provided at both ends of the flexible substrate.
Figure 17B:
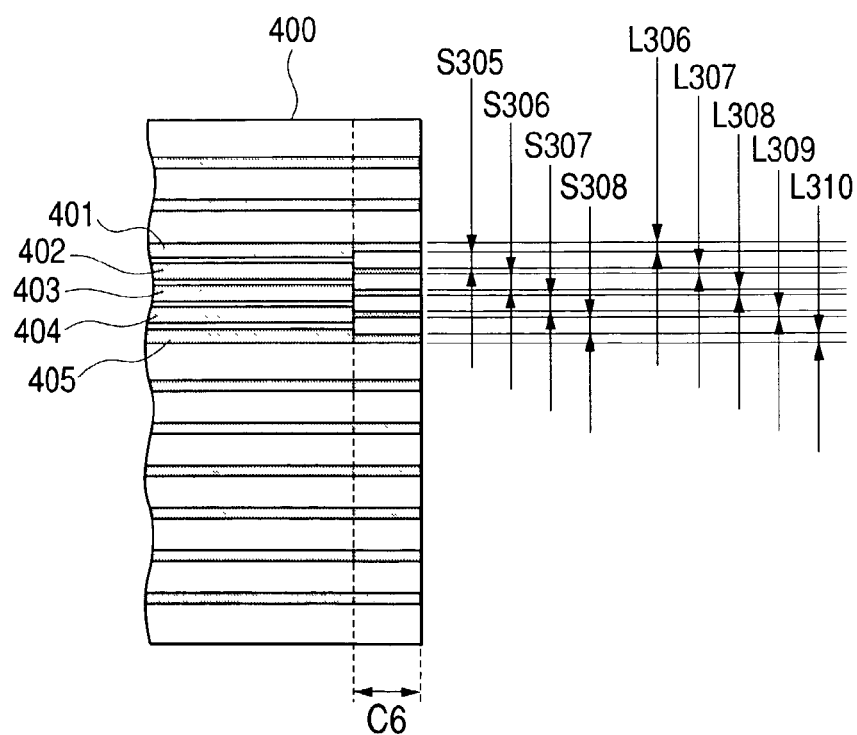

FIGS. 17A, 17B respectively illustrate an embodiment of a structure of the connecting points provided at both ends of the flexible substrate. FIG. 17A is a plan view of the connecting point C5 and FIG. 17B is an explanatory diagram of the plan view of the connecting point C6. The wiring widths L106 to L110 and wiring intervals S105 to S108 of the high speed signal transmission wirings 401 to 405 at the connecting point C5 are different in design from that in the region other than the connecting point C5. The wiring widths L106 to L110 and wiring intervals S105 to S108 at the connecting point C5 are determined considering the thickness t1 and dielectric constant of the ceramic substrate 103 in the side of transmitting optical system module 301, thickness (not illustrated) and conductivity of tungsten as a material of the high speed signal transmission wirings 115 to 119 formed on the ceramic substrate 103, thickness t3 and conductivity of the wirings 401 to 405 of the flexible wiring board 400, thickness t4, t5 and dielectric constant of the dielectric material layer 407 of the flexible wiring board 400 and thickness and conductivity of the solders 401' to 405' formed at the connecting point C5 and these values are adjusted to the relationship to provide the characteristic impedance of wiring at the connecting point C5 of about 50Ω under the condition that the connecting point C1 on the ceramic substrate 103 is connected to the connecting point C5 of the flexible substrate 400 with the solders 401' to 405'. The high speed signal transmission wirings 115 to 119 at the connecting point C1 on the ceramic substrate 103 and the high speed signal transmission wirings 401 to 405 at the connecting point C5 of the flexible wiring board 400 are identical in the size of the widths L106 to L109 and intervals S105 to S108 of the wirings which are corresponding with each other.

The wiring widths L306 to L310 and wiring intervals S305 to S308 of the high speed signal transmission wirings 401 to 405 at the connecting point C5 of the flexible wiring board 400 are different in the design from that of the region other than the connecting point C6. The wiring widths L306 to L310 and wiring intervals S305 to S308 at the connecting point C5 are determined considering thickness and dielectric constant of the printed wiring board 600, thickness (not illustrated) and conductivity of copper as a material of the high speed signal transmission wirings 621 to 623 formed on the printed circuit board 600, thickness t3 and conductivity of wirings 401 to 405 of the flexible wiring board 400, thickness t4, t5 and dielectric constant of the dielectric material layer 407 of the flexible wiring board 400 and thickness and conductivity of solders 401" to 405" formed at the connecting point C6 and these values are adjusted to provide the relationship to provide the characteristic impedance of wiring at the connecting point C6 of about 50Ω. The high speed signal transmission wirings 621 to 623 at the connecting point C4 of the printed circuit board 600 are identical to the high speed signal transmission wirings 401 to 405 at the connecting point C6 of the flexible wiring substrate 400 in the size of the widths L306 to L309 and intervals S30 to S308 of the wirings corresponding with each other.

Figure 18A:
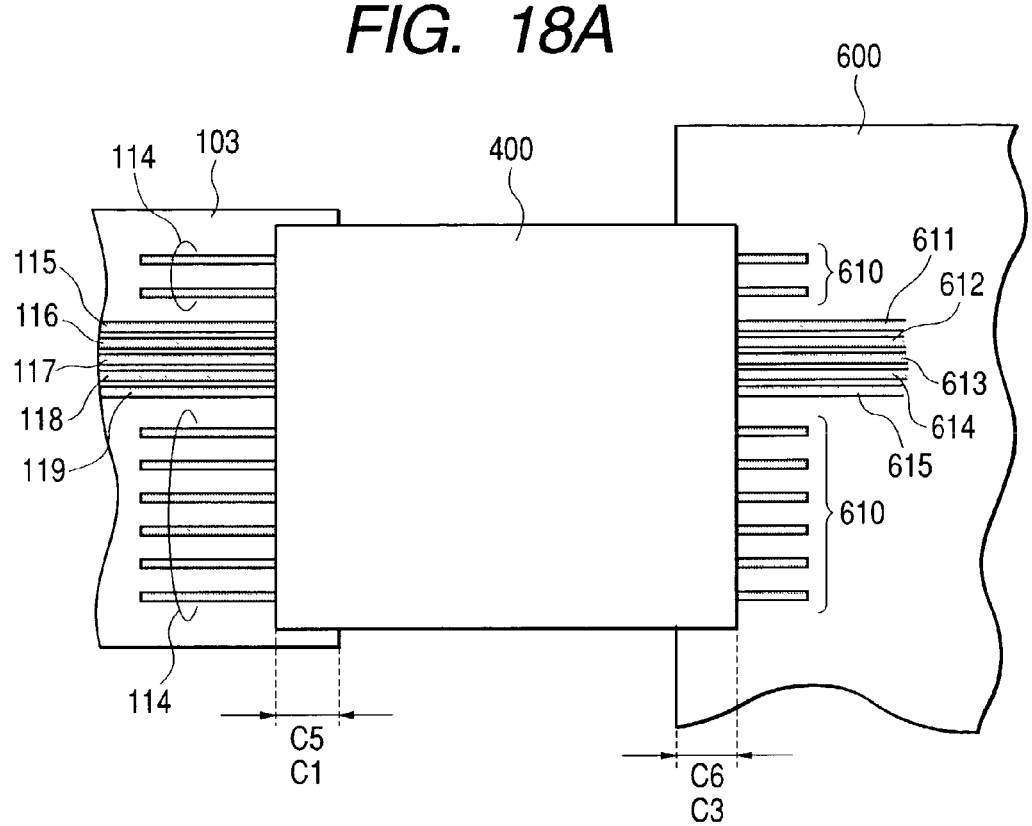
FIGS. 18A, 18B respectively illustrate a first embodiment of the connection between the connecting point C1 on the ceramic substrate and the connecting point C3 on the printed circuit board in the transmitting optical system module side through the use of the flexible wiring board of FIGS. 16 and 17.
Figure 18B:
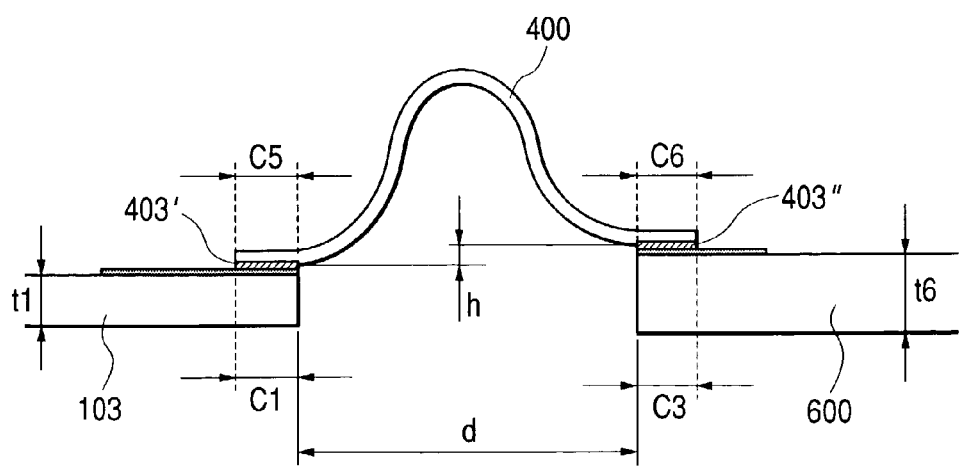

FIGS. 18A, 18B respectively illustrate a first embodiment of the connection between the connecting point C1 on the ceramic substrate and the connecting point C3 on the printed circuit board in the transmitting optical system module side through the use of the flexible wiring board of FIGS. 16 and 17. FIG. 18A is a plan view and FIG. 18B is a side elevation diagram. The connecting sequence of the flexible substrate 400 is as follows. After the transmitting optical system module 301, receiving optical system module 306 and printed circuit board 500 are all accommodated and fixed within the cabinet 601 of the optical communication module, a positional relationship between the connecting point C5 of the flexible substrate 400 and the connecting point C1 of the ceramic substrate 103 is adjusted with a handling mechanism not illustrated and these connecting points C5 and C1 are connected by fusing the solders 401' to 405' at the connecting points by heating these points from the side of flexible substrate 400 using a heater not illustrated. Thereafter, the positional relationship between the connecting point C6 of the flexible substrate 400 and the connecting point C3 of the printed circuit board 600 is adjusted with the handling mechanism not illustrated and these connecting points C6 and C3 are connected by fusing the solders 401" to 405" at the connecting points by heating these points from the side of flexible substrate 400 using the heater not illustrated. An interval d between the ceramic substrate 103 and printed circuit board 600 is about 8 mm.

As explained above, since the signals are connected between the transmitting optical system 301 and the printed circuit board 600 using the flexible wiring board 400, if the relative positional relationship is fluctuated between the transmitting optical system 301 and printed circuit board 600 in the optical communication module, the stable connection can always be attained under the constant condition. Moreover, if thickness t1 of the ceramic substrate 103, thickness t6 of the printed circuit board 600, distance d between the ceramic substrate 103 and printed circuit board 600 or difference h of heights of the connecting points at respective substrates is changed due to the difference in the type of components, highly reliable connection can be realized using the same flexible wiring board 400. Moreover, in regard to the solders 401' to 405' used at the connecting point C5 of the flexible wiring board and the solders 401" to 405" used at the connecting point C6, when difference of about $10_o$) to $20_o$) is given to the melting points of the solders with the method, for example, to change the composition of tin and silver or the like and the higher melting point solder is used for the connection at the preceding connection sequence, such a disadvantage that one solder (having completed the connection) is fused with thermal conduction generated when the other solder is heated can be eliminated.

In the above explanation, connection between the transmitting optical system module 301 and printed circuit board 600 has been described and the flexible substrate 500 is used for connection between the receiving optical system module 306 and printed circuit board 600. A structure of the flexible substrate 500 is different from the flexible substrate 400 only in the number of wirings and wiring width and interval of the high speed signal transmission wirings and the basic concept thereof to match the characteristic impedance of the high speed signal transmission wiring to about 50Ω is same as that of the flexible substrate 400. Therefore, the same explanation is not repeated here.

Figure 19A:
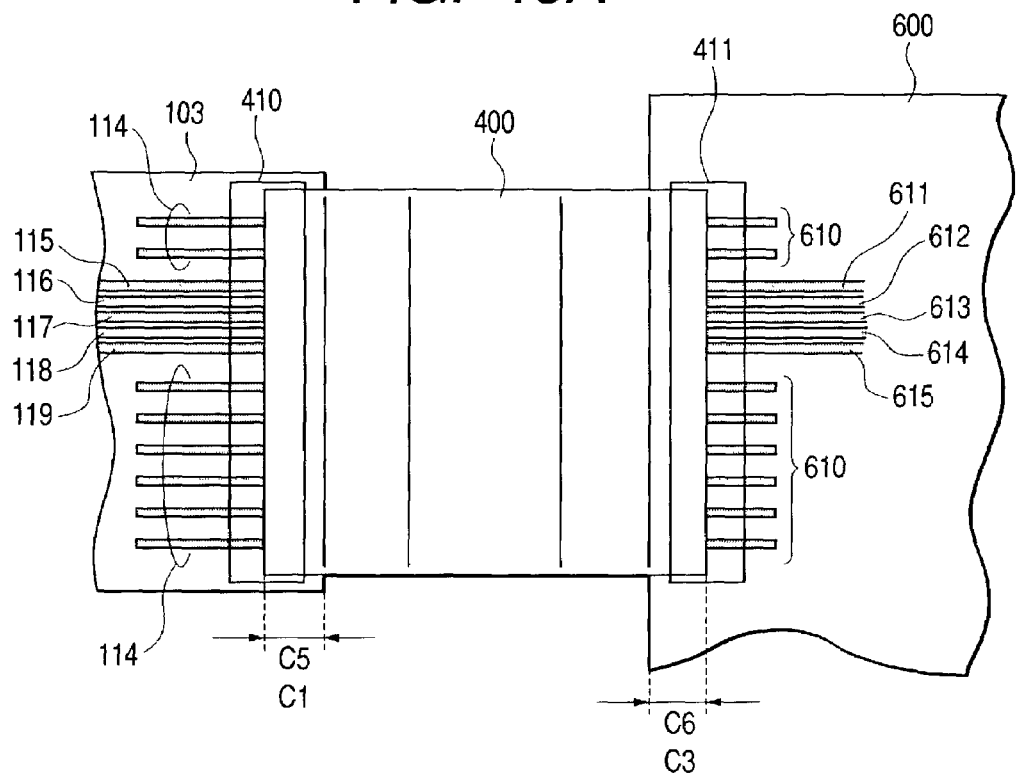
FIGS. 19A, 19B respectively illustrate a second embodiment of the connection between the connecting point C1 on the ceramic substrate and the connecting point C3 on the printed circuit board in the transmitting optical system module side through the use of the flexible wiring board of FIGS. 16 and 17.
Figure 19B:
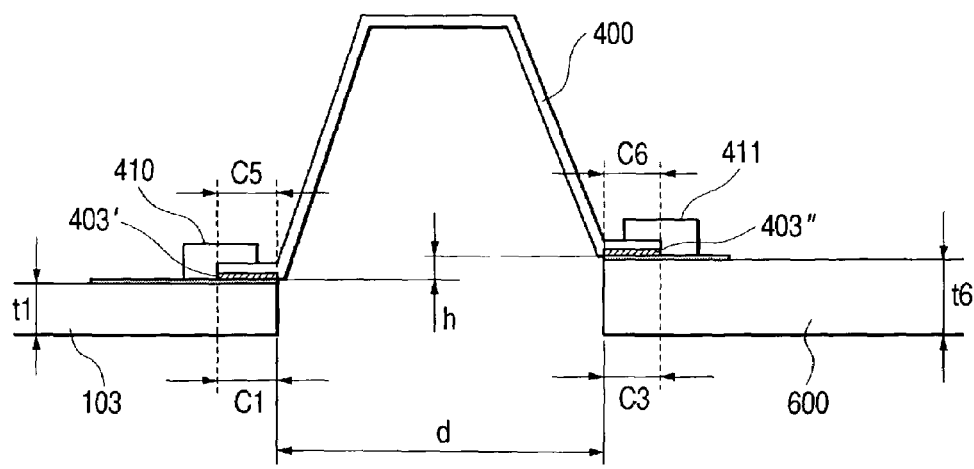

FIGS. 19A, 19B respectively illustrate a second embodiment of the connection between the connecting point C1 on the ceramic substrate and the connecting point C3 on the printed circuit board in the transmitting optical system module side through the use of the flexible wiring board of FIGS. 16 and 17. FIG. 19A is a plan view and FIG. 19B is a side elevation diagram. The total length of the flexible substrate 400 used in this embodiment is 25 mm and the flexible substrate 400 is previously formed (bent) in the trapezoidal shape for use. The connection sequence of the flexible substrate 400 is as follows. The transmitting optical system module 301, receiving optical system module 306 and printed circuit board 600 are all accommodated within the cabinet of optical communication module and then fixed. Thereafter, the positional relationship between the connecting point C5 of the flexible substrate 400 and the connecting point C1 of the ceramic substrate 103 are adjusted with the handling mechanism not illustrated and the connecting points C5 and C1 are connected by heating the connecting points from the side of the flexible substrate 400 using the heater not illustrated in order to fuse the solders 401' to 405' at the connecting points. Thereafter, the positional relationship between the connecting point C6 of the flexible substrate 400 and the connecting point C3 of the printed circuit board 600 is also adjusted with the handling mechanism not illustrated and the connecting points C6 and C3 are connected by heating the connecting points from the side of flexible substrate 400 using the heater not illustrated in order to fuse the solders 401" to 405" at the connecting points. An interval d between the ceramic substrate 103 and printed circuit board 600 is about 8 mm.

According to this embodiment, in addition to the merit explained in regard to the first embodiment, it is possible to alleviate a stress to be applied to the connecting point (solder) resulting from the shape of the flexible wiring board 400 after the end of connection. Namely, the first embodiment is accompanied by the possibility that a stress is centralized only to any one of connecting point (solder) because of the influence of the shape (like a bow) of the flexible substrate 400 having completed the connection and thereby reliability of connecting point is probably deteriorated. According to this embodiment, however, a stress to be applied to the connecting point (solder) can remarkably be reduced by previously forming the flexible wiring board 400 into the trapezoidal shape before completion of the connection. In the case of previous forming of the flexible wiring board 400, the optimum shape of the flexible wiring board 400 may be set to a crank shape or a triangular shape depending on the conditions of the distance d between the ceramic substrate 103 and printed circuit board 600 and difference h of heights of the connecting point C1 on the ceramic substrate 103 and the connecting point C3 on the printed circuit board 600.

Figure 23A:
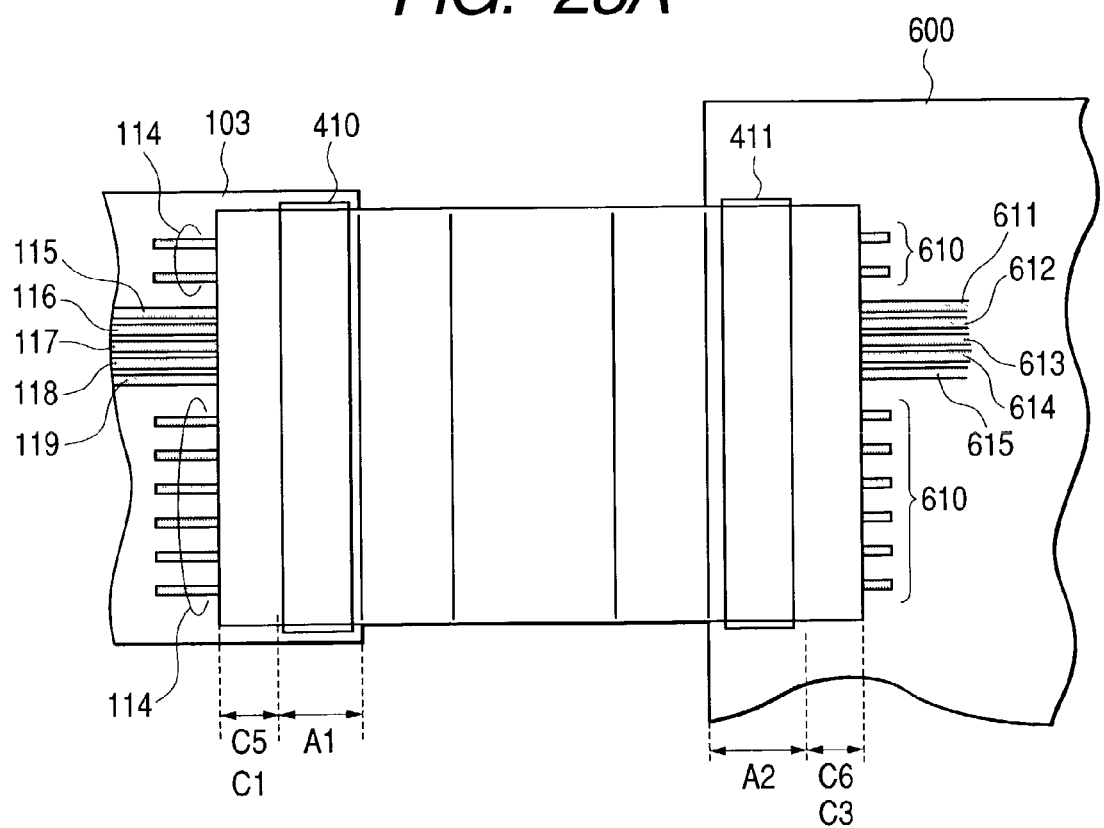
FIGS. 23A, 23B respectively illustrate a third embodiment of connection between the connecting point C1 on the ceramic substrate and the connecting point C3 on the printed circuit board in the transmitting optical system module side through the use of the flexible wiring board of FIGS. 16 and 17.
Figure 23B:
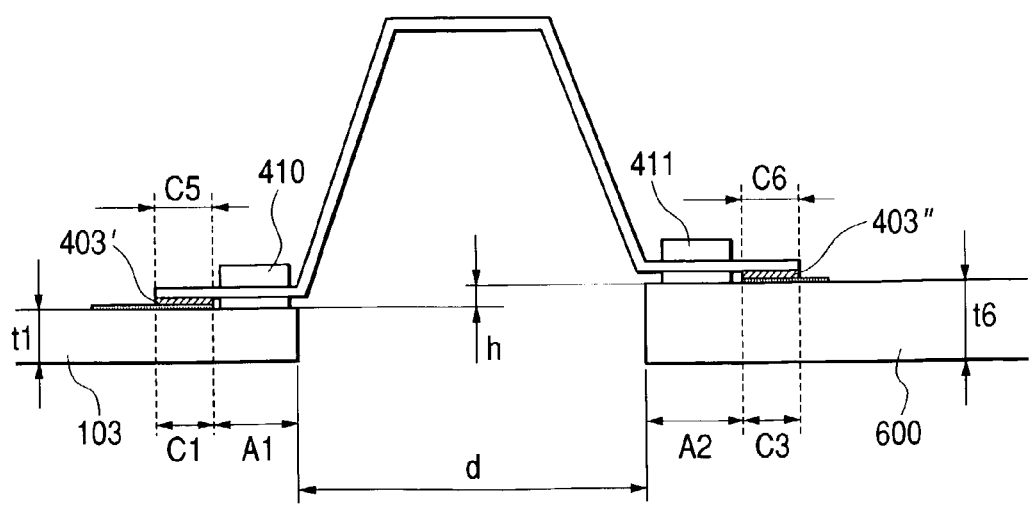
Figure 24:
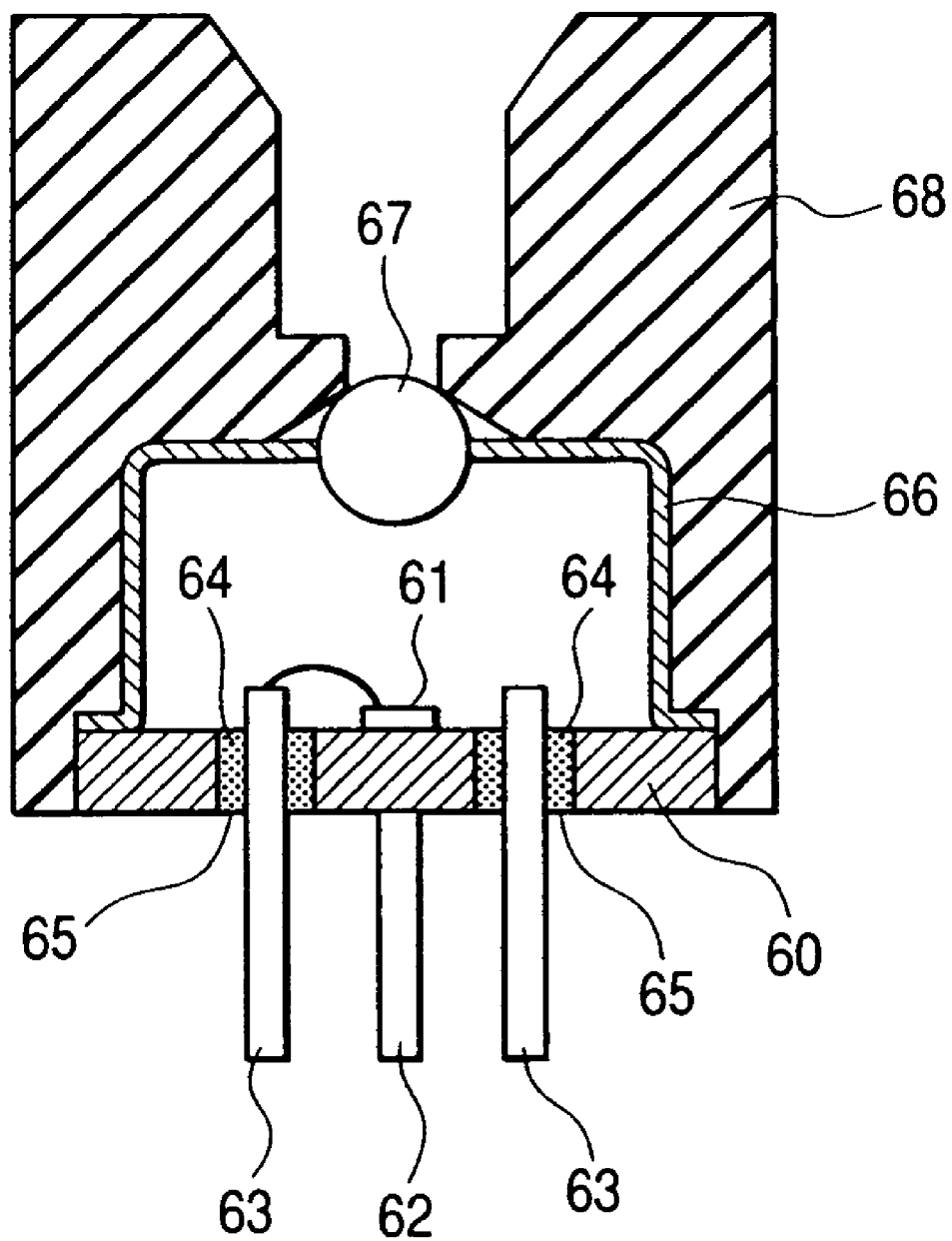
FIG. 24 is a cross-sectional view of side elevation of the optical communication module of the related art.

Moreover, as a method of reducing a stress to be applied to the solder after the connection, it is recommended also to reinforce the peripheral area of the connecting points on the ceramic substrate 103 and printed circuit board 600 with resins 410, 411 such as a bonding agent or the like. However, since it is required to keep constant as much as possible the characteristic impedance of the high speed signal transmission wiring, it is preferable to select, as the material of the resins 410, 411 used, the same material as the dielectric material layer of the flexible wiring board 400 (for example, polyimide) or a material having the specific dielectric constant as nearer to 1 as possible. The resin 410 is also used between the solder plating (for example, between the solders 403'and 404') respectively connecting the wiring 114 and high speed signal transmission wirings 115 to 119 on the ceramic substrate 103 and the wiring 406 and high speed signal transmission wirings 401 to 405 of the flexible wiring board 400. Moreover, the resin 411 is also used between the solder plating (for example, between the 403" and 404") respectively connecting the wiring 610 and high speed signal transmission wirings 611 to 615 on the printed circuit board 600 and the wiring 406 and high speed signal transmission wirings 401 to 405 of the flexible wiring board 400. In addition, it is also possible to provide the resins 410 and 411 to the ceramic substrate 103 and printed circuit board 600 as illustrated in FIG. 23 by preparing for the spaces A1 and A2 for reinforcement by resin.

FIGS. 20A, 20B, 20C respectively illustrate a third embodiment of the flexible wiring board. FIG. 20A is a plan view, FIG. 20B is a front elevation diagram and FIG. 20C is a cross-sectional view of the desired wiring on the flexible wiring board (parallel to the wiring direction). The flexible wiring board of this embodiment is different from the flexible wiring board explained with reference to FIGS. 16A, 16B, 16C and FIGS. 17A, 17B and is used in the side of the transmitting optical system module 301. According to the cross-sectional structure, a copper shield layer 451 is provided in the thickness t8 (about 30 µm in this embodiment) over the high speed signal transmission wirings 401 to 405 of the co-planer structure. The wirings 401 to 406 (copper wiring in this embodiment) are formed in the thickness t3 (about 30 µm in this embodiment) to the flexible wiring board 450 and the dielectric material layers 407 (polyimide in this embodiment) are laminated only in the thickness t7 (about 100 µm in this embodiment) and t5 (about 50 µM in this embodiment) as the upper and lower layers thereof. The high speed signal transmission wirings 401 to 405 are composed of two differential signal wirings 402 and 404 as the signal wirings to transmit the signals having polarities inverted with each other. With this differential signal system, energy loss of signal and unwanted radiation to external circuit can be controlled. The grounded wirings 401, 403, 405 are formed in both sides of the differential signal wirings 402 and 404 and between these signal wirings and the grounded wirings 401, 403, 405 and a shield layer 451 are connected via a via-hole 452 (made of copper). The wiring widths L601 to L605 and wiring intervals S601 to 604 of the high speed signal transmission wirings 401 to 405 are determined depending on the parameters such as thickness t5 and dielectric constant of the dielectric material layer 407 laminated under the wirings 401 to 406, interval t9 up to the shield layer 451 at the upper part of the wirings 401 to 406 and thickness t3 and conductivity of copper as a material of the high speed signal transmission wirings 401 to 405 and these values are adjusted to the relationship to provide the characteristic impedance of wiring of about 50Ω. The wiring 406 is a signal line for controlling the laser diode stored in the transmitting module 100 to mainly transmit a DC signal. Therefore, it is not required to consider the characteristic impedance of wiring for the width of wiring 406 and interval between the wirings 406. Total length of the flexible wiring board is about 15 mm and the total width thereof is about 8 mm.

At both ends of the flexible wiring board 450, the connecting point C5 for the connecting point C1 on the ceramic substrate 103 in the side of transmitting optical system module 301 and the connecting point C6 for the connecting point C3 on the printed circuit board 600 are provided. On the wirings 401 to 406 of the connecting points C5 and C6 at both ends of the flexible substrate 400, the solder platings of 401' to 406' and 401" to 406" are formed in the thickness of about 20 µm. Since the structure of the connecting points C1 and C5 is same as that of FIGS. 17A, 17B, the same explanation is not repeated here. Moreover, the flexible wiring board 450 with a shield may also be formed (bent) previously in the trapezoidal shape as explained with reference to FIGS. 19A, 19B. Moreover, connection between the transmitting optical system module 301 and the printed circuit board 600 is explained with reference to FIGS. 20A, 20B, 20C but the flexible substrate with shield can also be used as the flexible substrate used for connection of the receiving optical system module 306 and printed circuit board 600. In this case, this flexible substrate is different only in the number of wirings and wiring width/interval of the high speed signal transmission wirings and the basic concept for matching the characteristic impedance of the high speed signal transmission wiring to about 50Ω is identical to that of the flexible substrate 450. Therefore the same explanation is not repeated here.

With introduction of the flexible wiring board with shield of FIGS. 20A, 20B, 20C, unwanted radiation of signal from the flexible wiring board can be controlled and signal crosstalk generated by receiving noise from electronic components loaded to the printed circuit board 600 with the flexible wiring board can be avoided simultaneously. Moreover, a signal crosstalk generated between the flexible wiring boards of the transmitting module and receiving module accommodated in the cabinet 601 of the optical communication module can also be reduced.

Next, a structure of the transmitting module for effectively radiating the heat generated from the inside of the transmitting module structured as illustrated in FIGS. 8A, 8B, 8C and a structure of the receptacle type optical communication module loading above transmitting module will then be explained.

Figure 21A:
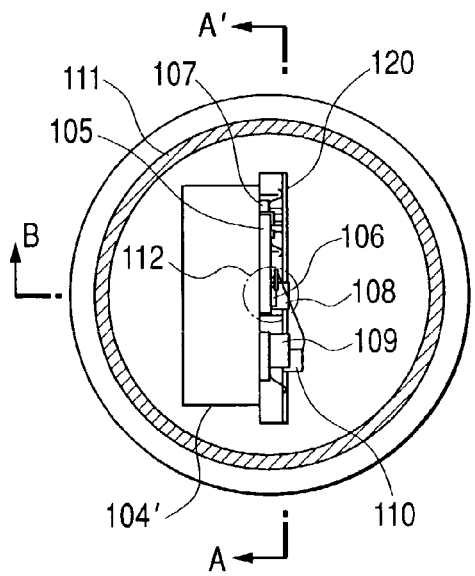
FIGS. 21A, 21B, 21C respectively illustrate a structure of an eighth embodiment of the optical communication module of the present invention.
Figure 21B:
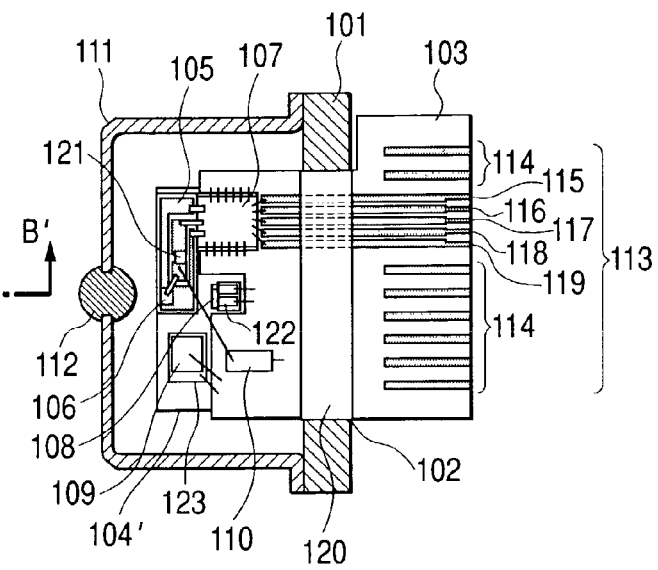
Figure 21C:
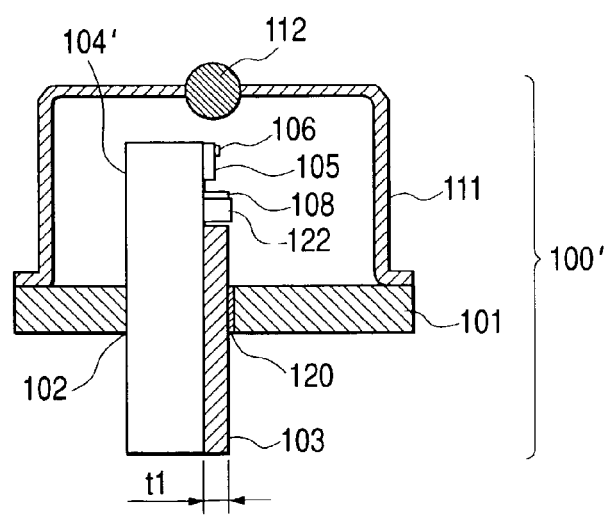

FIGS. 21A, 21B, 21C respectively illustrate a structure of an eighth embodiment of the optical communication module of the present invention. FIG. 21A is a plan view, FIG. 21B and FIG. 21C are respectively cross-sectional views of FIG. 21A along the lines A–A' and B–B'. In this embodiment, a structure of the transmitting module loading the laser diode is explained. The wired ceramic substrate 103 is fixed through the disc type can-stem 101. Moreover, the metal stem 104' is also fixed through the can-stem 101. The laser diode carrier 105, laser diode 106, driver LSI 107, monitor photodiode 108, thermistor 109 and inductor 110 for bias terminal or the line are disposed and fixed on the surface parallel to the optical axis of the metal stem 104'. On the upper surface of the can-stem 101, the can-cap 111 is fixed. At the center of the upper surface of the can-cap 111, the lens 112 is fixed.

The disc type can-stem 101 is a metal stem made of cover or the like and is previously provided with the substrate through-hole 102 to provide the ceramic substrate 103 and metal stem 104'. The ceramic substrate 103 is formed of alumina or aluminum nitride or the like and is also provided with a wiring required as the electric circuit, an electrode for wire boding (details are not illustrated) and an external electrode 113 required for connection with external circuit of the module. The wiring can be formed by printing of paste such as tungsten or the burning process. Moreover, a through-hole is formed as required to form a multilayer wiring substrate. The plating of Ni/Au is also provided over tungsten or the like of the wire bonding electrode and external electrode 113. At the area in contact with the can-stem 101 at the substrate through-hole 102 of the ceramic substrate 103, a metallized layer of tungsten/Ni/Au is also formed. The metal stem 104' is made of a metal material having a large thermal conductivity (200 W/(m·K)) such as a copper-tungsten alloy and a thermal expansion coefficient (5 to 7 $_o{}^y 10^{-6}/_o$) identical to that of covar of can-stem 101 and alumina or aluminum nitride of ceramic substrate. At the area in contact with the can-stem 101 in the through-hole 102 of the metal stem 104', a metallized layer of tungsten/Ni/Au is also formed. The metal stem 104' of the copper-tungsten alloy transfers heat generated from the driver LSI 107 explained later and leaks effectively this to the can-stem 101. The ceramic substrate 103 and metal stem 104' are fixed to the can-stem 101 with the silver alloy brazing process at the substrate through-hole 102. An insulation layer 120 (alumina) is also provided on the wiring forming surface of the ceramic substrate. As explained above, hermetical sealing at the connecting point of the can-stem 101, ceramic substrate 103 and metal stem 104'can be ensured.

The laser diode carrier 105 is loaded on the plane parallel to the optical axis of the metal stem 104'. This loading is realized with the soldering process, for example, of gold-tin or tin-silver alloy or the like. The laser diode carrier 105 is a ceramic substrate made of aluminum nitride or the like and an impedance matching resistor 121 is also formed on this laser diode carrier 105. As this impedance matching resistor 121, a thin film resistor of nickel chrominum or a chip resistor formed on the laser diode carrier 105, for example, are used. The laser diode 106 is loaded on this laser diode carrier 105. This loading is realized, for example, with the soldering process of the gold-tin or tin-silver alloy, etc. A signal beam of the laser diode 106 is emitted toward the lens 112 and the positions of the metal stem 104', laser diode carrier 105 and laser diode 106 are determined to locate the center of emission to the center of the disc type can-stem 101. When the impedance matching resistor 121 is unnecessary, the laser diode 106 may be loaded in direct on the metal stem 104 without use of the laser diode carrier 105.

The driver LSI 107 to drive the laser diode 106 is loaded on the metal stem 104'as nearer as possible to the laser diode carrier 105. This loading is realized, for example, by the soldering process of the gold-tin or tin-silver alloy or with the fixing by the bonding agent such as a silver-epoxy-based bonding agent or the like. In this embodiment, the driver LSI 107 uses the 17 terminals and the driver LSI 107 is provided near the laser diode 106 by introducing the structure where the ceramic substrate 103 is provided through the can-stem 101. Thereby 17 wirings may be guided to the external side of the can. In the figure, the wiring 114 is expressed with 8 wirings for simplifying the figure.

The monitor photodiode 108 is loaded previously to the monitor photodiode carrier 122 and its photosensitive surface is disposed at the position for receiving the laser beam emitted from the rear surface of the laser diode 106. Loading of the monitor photodiode 108 to the monitor photodiode carrier 122 and loading the of the monitor photodiode carrier 122 to the metal stem 104' are realized, for example, by the soldering process of the gold-tin or tin-silver alloy or the like. The monitor photodiode carrier 122 is provided with the surface for loading the monitor photodiode 108 and with the wiring at the surface parallel to the surface of the ceramic substrate 103.

The thermistor 109 for monitoring temperature of the laser diode 106 is loaded to the thermistor carrier 123 made of aluminum nitride or the like for electrical insulation from the metal stem 104' and the thermistor carrier 123 is then disposed on the metal stem 104'near the laser diode 106. Loading of the thermistor 109 on the thermistor carrier 123 is realized, for example, with the soldering process of the gold-tin or tin-silver alloy. The thermistor 109 may also be loaded on the laser diode carrier 105. Moreover, in this embodiment, an inductor 110 is also loaded on the ceramic substrate 103 for preventing the leak of high frequency drive signal to the external side from the bias terminal in connection to the terminal for giving the bias potential of the laser diode 106. Loading of the inductor 110 on the ceramic substrate 103 is realized, for example, with the soldering process of gold-tin or tin-silver alloy or the like. The components explained above are electrically connected with the wire bonding or ribbon bonding.

Figure 22A:
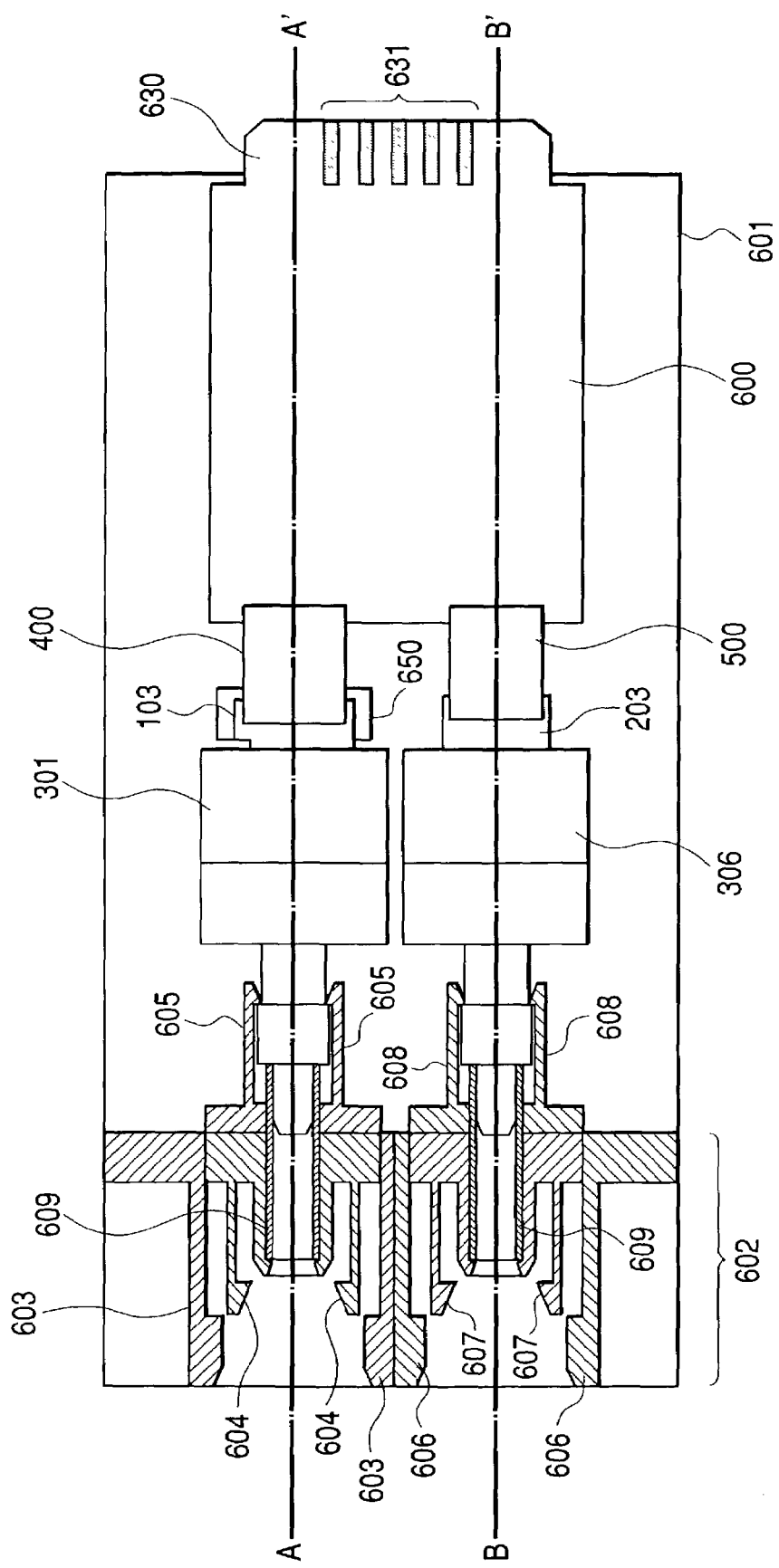

On the other hand, the cylindrical can-cap 111 is formed of the same material as the can-stem 101 such as covar and the center area of the upper plate is opened and is sealed with the lens 112 using a glass material. In this embodiment, as the lens 112, an aspherical lens having less spherical aberration is used to obtain higher optical coupling efficiency between the laser beam from the laser diode 106 and the optical fiber (not illustrated) to receive such laser beam, but a low price ball lens may also be sued when the laser beam power is enough high. The can-cap 111 is mounted to the can-stem 101 to locate the center of light emission of the laser diode 106 to the center of the lens 112. In this method, the laser diode 106 is driven to emit the laser beam while the can-cap 111, for example, is overlapped on the can-stem 101 and the optimum position of the can-cap 111 on the can-stem 101 is obtained by measuring the laser beam power emitted from the lens 112 and the can-cap 111 and can-stem 101 are welded in the ring shape with the resistance welding method. Moreover, when the structure that the lens 112 is mounted to the external side of the can module is introduced, a glass plate (not illustrated) may be attached to the opening at the center of upper surface of the can-cap 111. In this case, hermetical sealing is not always required depending on the required reliability and sealing by a bonding agent is also permitted FIGS. 22A, 22B, 22C respectively illustrate a mounting structure of a second embodiment of the receptacle type optical communication module (transceiver module) provided with the transmitting and receiving functions. FIG. 22A is a partial plan view of cross-section, FIG. 22B is a cross-sectional view of FIG. 22A along the line A–A' and FIG. 22C is a cross-sectional view of FIG. 22A along the line B–B'. This optical communication module is structured to accommodate, within a cabinet 601, the transmitting optical system module 301 comprising the transmitting module 100', the receiving optical system module 306 comprising the receiving module 200, the printed circuit board 600 loading the control circuit of both optical systems module and the receptacle 602 for connecting the optical fiber from the external side to the transmitting/receiving optical system module. On the printed circuit board 600, the connector board 630 is formed and it may be used by inserting a plurality of optical communication modules to the connector engaging section provided on a sheet of mother board (not illustrated) The connector board 630 is formed to the printed circuit board 600 and a plurality of optical communication modules can be used by coupling these modules with the connector engaging portion provided on a sheet of mother board (not illustrated). The connector board 630 is provided with a wiring 631 for supplying the power source to the printed circuit board 600 from the mother board and for exchanging the signals between these elements. The wiring 631 is formed of copper of which surface is plated with the gold plating.

In the receptacle 602, the external shape of the fiber capillary of the transmitting/receiving optical systems module is restricted with the sleeve 609 and the optical coupling with less amount of loss of the optical beam can be realized by inserting with pressure the capillary (not illustrated), into the sleeve 609, at the end part of connector respectively inserted to the transmitting and receiving side from the external side of the optical communication module. The ceramic substrate 103 and the printed circuit board 600 in the side of the transmitting optical system module 301 and the ceramic block 203 and the printed circuit board 600 in the side of the receiving optical system module 306 are electrically connected with the flexible wiring boards 400 and 500 explained previously.

In the structure of this embodiment, heat generated from the driver LSI 107 of the laser diode 106 comprised in the transmitting module 100' is transferred to the cabinet 601 via the metal stem 104' of the transmitting module 100' and the heat radiation block 650. The heat radiation block 650 is formed of a material which assures excellent thermal conductivity such as copper-tungsten alloy or the like. The heat radiation block 650 and metal stem 104' and cabinet 601 are connected with the soldering process of gold-tin or tin-silver alloy or the like. Here, it is also possible to realize any one or both of the connection between the heat radiation block 650 and metal stem 104'and between the heat radiation block 650 and cabinet 601 with an adhesive thermal conductive sheet such as a copper tape not illustrated. In addition, since an elastic material is used as the adhesive thermal conductive sheet, it can be prevented that an external force applied to the cabinet 601 is transferred to the metal stem 104' via the heat radiation block 650.

Employment of the heat radiation block 650 successfully control warp of the ceramic substrate 103 and metal stem 104' which is generated by difference of thermal expansion coefficients of the ceramic substrate 103 and metal stem 104' due to the influence of heat generated from the driver LSI 107 within the transmitting module 100'. Thereby, a tracking error (deviation of optical axis of the laser diode 106) of the transmitting module 100'can be controlled in order to improve reliability of operation of the optical communication module.

As explained above, in the optical communication module of the present invention, since desired number of wirings including the high speed signal transmission wirings can be formed on the ceramic substrate by providing this ceramic substrate through the stem of the can-package, the necessary components other than the light emitting/photosensitive elements such as driver LSI and amplifier IC or the like may also be loaded near the light emitting/photosensitive elements within the can-package and thereby high speed signal transmission can be realized under low noise condition.

Moreover, according to the embodiments of the present invention, the receptacle type optical communication module which can realize high speed signal transmission (10 Gbit/sec or more) can be realized by executing the signal connection between the transmitting side optical system module and printed circuit board and between the receiving side optical system module and the printed circuit board with the signal transmission wiring of the co-planer structure and the flexible wiring board of the structure providing the solder connecting points at both ends of the wirings.

Moreover, according to the embodiments of the present invention, if fluctuation is generated in the positional relationship of loading between the transmitting optical system module and printed circuit board and between the receiving optical system module and the printed circuit board within the optical communication module, reliability of electrical connections of these elements can be ensured by realizing, with the flexible wiring board, the signal connections between the transmitting side optical system module and the printed circuit board and between the receiving side optical system module and the printed circuit board.

Moreover, according to the embodiments of the present invention, since the signal connections between the transmitting side optical module system and the printed circuit board and between the receiving side optical system module and the printed circuit board are realized with the flexible wiring board, an external force applied to the printed circuit board when the optical communication module is inserted to or removed from the mother board is never transferred to the connecting points between the transmitting side optical system module and the printed circuit board and between the receiving side optical system module and the printed circuit board and reliability of electrical connections among these elements can also be assured.

Moreover, according to the embodiments of the present invention, an tracking error of the transmitting module can be controlled this transmitting module which is structured to transfer the heat generated from the drive LSI of laser diode comprised within the transmitting module to the cabinet through the metal stem of the transmitting module and the heat radiation block and thereby reliability of operation of the optical communication module can also be improved.

The invention may be embodied in other specific forms without departing from the spirit or essential characteristics thereof. The present embodiment is therefore to be considered in all respects as illustrative and not restrictive, the scope of the invention being indicated by the appended rather than by the foregoing description and all changes which come with in the meaning and range of equivalency of the claims are therefore intended to be embraced therein.

What is claimed is:

1. A transmitting optical communication module comprising:
   a receptacle for connecting an optical fiber from an external side of said optical communication module;
   a transmitter module comprising:
      a can-cap comprising a lens;
      a light emitting element;
      a ceramic substrate;
      at least one signal transmission line of said light emitting element disposed on said ceramic substrate and having a connecting segment that is narrower than a remaining segment thereof;
      a pair of ground lines disposed on said ceramic substrate and extending along both sides of said signal transmission line, each ground line having a connecting segment that is narrower than a remaining segment thereof; and
      a can-stem provided with a through-hole,
      wherein said ceramic substrate is fixed through said through-hole of said can-stem,
      wherein said light emitting element is disposed in a space within said can-cap which is sealed off by said can-stern, said light emitting element being optically coupled to said optical fiber via said lens,
      wherein spacing between said connecting segments of said signal transmission line and said ground lines is greater than spacing between said remaining segments thereof;
   a flexible wiring board having disposed thereon conductors, each conductor having a first connecting segment and a second connecting segment, both of which are narrower than a remaining segment thereof, wherein, spacing between said first connecting segments and spacing between said second connecting segments each is greater than spacing between said remaining segments; and
   a printed circuit board having disposed thereon conductors, each conductor having a connecting segment that is narrower than a remaining segment thereof, wherein spacing between said connecting segments is greater than spacing between said remaining segments,
   said connecting segments of said signal transmission line and of said ground lines being connected to respective ones of said first connecting segments of said flexible wiring board conductors,
   said second connecting segments of said conductors of said flexible wiring board being connected to respective ones of said connecting segments of said printed circuit board conductors,
   wherein a high frequency characteristic impedance of said signal transmission line is matched to about 50Ω.

2. A transmitting optical communication module according to claim 1, wherein said signal transmission line, said ground lines, said flexible wiring board conductors, and said printed circuit board conductors are substantially coplanar and configured for signal transmission of 10 Gbit/s or greater.

3. A transmitting optical communication module according to claim 1, wherein connections among said connecting segments are made by solder connections, including a resin to reinforce said solder connections.

4. A transmitting optical communication module according to claim 1, further comprising a second signal transmission line of said light emitting element and a third ground line, said signal transmission lines and said ground lines arranged on said ceramic substrate in alternating fashion.

5. A transmitting optical communication module according to claim 1, wherein said remaining segments of said signal transmission line, said ground lines, said flexible wiring board conductors, and said printed circuit board conductors are substantially of equal width, wherein said connecting segments of said signal transmission line, said ground lines, said flexible wiring board conductors, and said printed circuit board conductors are substantially of equal width.

6. A transmitting optical communication module according to claim 1, wherein said high frequency characteristic impedance is about 50Ω±2Ω.

7. A transmitting optical communication module according to claim 1, further comprising a connector board having a first end that is connected to said printed circuit board and having a second end that is configured for connection to a device external to said transmitting optical communication module.

8. A receiving optical communication module comprising:
   a receptacle for connecting an optical fiber from an external side of said optical communication module;
   a can-cap comprising a lens;
   a receiver module comprising:
      a photosensitive element
      a ceramic substrate;
      at least one signal transmission line of said photosensitive element disposed on said ceramic substrate and having a connecting segment that is narrower than a remaining segment thereof;
      a pair of ground lines disposed on said ceramic substrate and extending along both sides of said signal transmission line, each ground line having a connecting segment that is narrower than a remaining segment thereof; and
      a can-stem provided with a through-hole,
      wherein said ceramic substrate is fixed through said through-hole of said can-stem,
      wherein said photosensitive element is disposed in a space within said can-cap which is sealed off by said can-stem, said photosensitive element being optically coupled to said optical fiber via said lens,
      wherein spacing between said connecting segments of said signal transmission line and said ground lines is greater than spacing between said remaining segments thereof;
   a flexible wiring board having disposed thereon conductors, each conductor having a first connecting segment and a second connecting segment, both of which are narrower than a remaining segment thereof, wherein spacing between said first connecting segments and spacing between said second connecting segments each is greater than spacing between said remaining segments; and a printed circuit board having disposed thereon conductors, each conductor having a connecting segment that is narrower than a remaining segment thereof, wherein spacing between said connecting segments is greater than spacing between said remaining segments, said connecting segments of said signal transmission line and of said ground lines being connected to respective ones of said first connecting segments of said flexible wiring board conductors, said second connecting segments of said conductors of said flexible wiring board being connected to respective ones of said connecting segments of said printed circuit board conductors, wherein a high frequency characteristic impedance of said signal transmission line is matched to about 50Ω.

9. A receiving optical communication module according to claim 8, wherein said signal transmission line, said ground lines, said flexible wiring board conductors, and said printed circuit board conductors are substantially coplanar and configured for signal transmission of 10 Gbit/s or greater.

10. A receiving optical communication module according to claim 8, wherein connections among said connecting segments are made by solder connections, including a resin to reinforce said solder connections.

11. A receiving optical communication module according to claim 8, wherein said high frequency characteristic impedance is about 50Ω±2Ω.

12. A receiving optical communication module according to claim 8, further comprising a connector board having a first end that is connected to said printed circuit board and having a second end that is configured for connection to a device external to said receiving optical communication module.

* * * * *

UNITED STATES PATENT AND TRADEMARK OFFICE
CERTIFICATE OF CORRECTION

PATENT NO.         : 7,215,886 B2
APPLICATION NO.    : 10/222163
DATED              : May 8, 2007
INVENTOR(S)        : Shigenobu Maruyama et al.

It is certified that error appears in the above-identified patent and that said Letters Patent is hereby corrected as shown below:

Title Page:

In column 1 at (73),

"assignee: Hitachi, Ltd., Tokyo (JP)"

Should read,

--assignees: OpNext Japan, Inc., Kanagawa (JP)--

Signed and Sealed this

Nineteenth Day of May, 2009

JOHN DOLL
*Acting Director of the United States Patent and Trademark Office*